(12) United States Patent
Noh et al.

(10) Patent No.: US 11,762,469 B2
(45) Date of Patent: Sep. 19, 2023

(54) DISPLAY DEVICE AND HAPTIC FEEDBACK METHOD OF THE SAME

(71) Applicant: Samsung Display Co., LTD., Yongin-si (KR)

(72) Inventors: Jung Hun Noh, Yongin-si (KR); Yi Joon Ahn, Seoul (KR); Ga Na Kim, Icheon-si (KR); So Young Yeo, Suwon-si (KR); Eun Kyung Yeon, Suwon-si (KR); Jae Been Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 263 days.

(21) Appl. No.: 16/986,168

(22) Filed: Aug. 5, 2020

(65) Prior Publication Data
US 2021/0181847 A1   Jun. 17, 2021

(30) Foreign Application Priority Data

Dec. 17, 2019   (KR) ........................ 10-2019-0168431

(51) Int. Cl.
*G06F 3/01* (2006.01)
*G06F 3/041* (2006.01)
*G06F 3/044* (2006.01)
*H10N 30/20* (2023.01)

(52) U.S. Cl.
CPC ............ *G06F 3/016* (2013.01); *G06F 3/0412* (2013.01); *G06F 3/0447* (2019.05); *G06F 3/04146* (2019.05); *H10N 30/20* (2023.02); *G06F 2203/04105* (2013.01)

(58) Field of Classification Search
CPC .... G06F 3/016; G06F 3/04146; G06F 3/0447; G06F 3/0412; G06F 3/044; G06F 2203/04105; H01L 41/09
See application file for complete search history.

(56) References Cited

U.S. PATENT DOCUMENTS

| | | |
|---|---|---|
| 8,059,105 B2 | 11/2011 | Rosenberg et al. |
| 8,749,507 B2 | 6/2014 | Dacosta et al. |
| 8,773,356 B2 | 7/2014 | Martin et al. |
| 10,088,927 B2 | 10/2018 | Rothkopf et al. |
| 10,504,341 B2 | 12/2019 | Khoshkava et al. |
| 10,539,979 B2 | 1/2020 | Ha et al. |
| 10,581,343 B2 | 3/2020 | Khoshkava |

(Continued)

FOREIGN PATENT DOCUMENTS

| | | | | |
|---|---|---|---|---|
| CN | 102084328 A | * | 6/2011 | ............ G06F 3/016 |
| CN | 205983294 | | 2/2017 | |

(Continued)

*Primary Examiner* — Doon Y Chow
*Assistant Examiner* — Dennis Chow
(74) *Attorney, Agent, or Firm* — H.C. Park & Associates, PLC

(57) ABSTRACT

A display device and a haptic feedback method having the same provide a display panel which displays an image, a cover window on a first surface of the display panel and including a tactile pattern, and an actuator which is disposed on a second surface opposite the first surface of the display panel and overlaps the tactile pattern in a width direction of the display panel. The actuator outputs a sensing voltage according to applied pressure and generates vibrations according to applied driving voltages.

25 Claims, 36 Drawing Sheets

(56) References Cited

U.S. PATENT DOCUMENTS

| | | | |
|---|---|---|---|
| 10,921,981 B2 * | 2/2021 | Tsai | ............... G06F 1/1684 |
| 2010/0231550 A1 | 9/2010 | Cruz-Hernandez et al. | |
| 2013/0076649 A1 * | 3/2013 | Myers | ................ G06F 3/041 |
| | | | 361/679.01 |
| 2016/0147375 A1 * | 5/2016 | Bok | ............... G06F 3/04166 |
| | | | 345/175 |
| 2017/0068318 A1 | 3/2017 | McClure et al. | |
| 2019/0332176 A1 * | 10/2019 | Yang | ................ G06F 3/016 |

FOREIGN PATENT DOCUMENTS

| | | |
|---|---|---|
| JP | 2005-148809 | 6/2005 |
| KR | 10-1398496 | 5/2014 |
| KR | 10-2017-0073497 | 6/2017 |
| KR | 10-2018-0106918 | 10/2018 |
| KR | 10-2019-0013339 | 2/2019 |

* cited by examiner

DISPLAY DEVICE AND HAPTIC FEEDBACK METHOD OF THE SAME

CROSS-REFERENCE TO RELATED APPLICATION

This application claims priority from and the benefit of Korean Patent Application No. 10-2019-0168431, filed on Dec. 17, 2019, which is hereby incorporated by reference for all purposes as if fully set forth herein.

BACKGROUND

Field

Exemplary embodiments of the invention relate generally to a display device and a haptic feedback method of the same.

Discussion of the Background

As the information society develops, the demand for display devices for displaying images is increasing in various forms. For example, display devices may be implemented as various electronic devices such as smartphones, digital cameras, notebook computers, navigation devices, and smart televisions.

As display devices are implemented as various electronic devices, display devices with various designs are being required. For example, when a display device is implemented as a smartphone, physical buttons such as a power button and a sound button disposed on a side surface of the display device may be removed to increase the aesthetic appeal of the smartphone. In this case, an area for recognizing the pressure applied by a user may be provided instead of a physical button to provide the same function as the physical button. However, since it is difficult for the user to tactually feel the area to apply pressure, it may be difficult for the user to find the area to apply pressure. In addition, when the user applies pressure, if mechanical deformation does not occur as when a physical button is pressed, it may be difficult for the user to recognize whether the user has properly applied pressure.

The above information disclosed in this Background section is only for understanding of the background of the inventive concepts, and, therefore, it may contain information that does not constitute prior art.

SUMMARY

Exemplary embodiments provide a display device including a tactile pattern that can be tactually felt by a user to enable the user to easily find an area to apply pressure to perform a desired function, and a feedback provision method of the display device.

Exemplary embodiments also provide a display device which cannot only sense pressure applied by a user but also provide haptic feedback using an actuator so that the user can easily recognize whether a desired function is properly performed by the pressure applied by the user, and a feedback provision method of the display device.

Additional features of the inventive concepts will be set forth in the description which follows, and in part will be apparent from the description, or may be learned by practice of the inventive concepts.

An exemplary embodiment of the invention provides a display device including a display panel which displays an image; a cover window on a first surface of the display panel and including a tactile pattern; and an actuator which is disposed on a second surface opposite the first surface of the display panel and overlaps the tactile pattern in a width direction of the display panel. The actuator outputs a sensing voltage according to applied pressure and generates vibrations according to applied driving voltages.

Another exemplary embodiment of the invention provides a display device including a display layer which displays an image; a sensor electrode layer which is disposed on the display unit and senses a touch of a user; and an actuator under the display layer, outputs a sensing voltage according to applied pressure, and generates vibrations according to applied driving voltages.

Another exemplary embodiment of the invention provides a display device including a display layer which displays an image; a sensor electrode layer which is disposed on the display unit and senses a touch of a user; and a plurality of actuators which are disposed under the display layer and spaced apart from each other. Each of the actuators outputs a sensing voltage according to applied pressure and generates vibrations according to applied driving voltages.

Another exemplary embodiment of the invention provides a display device including a display panel which displays an image; a cover window on a first surface of the display panel; and first and second actuators disposed on a second surface opposite the first surface of the display panel and spaced apart from each other. Each of the first and second actuators outputs a sensing voltage according to applied pressure and generates vibrations according to applied driving voltages.

Another exemplary embodiment of the invention provides a haptic feedback method of a display device including applying pressure to a first surface of a display device by a user; calculating a touch position of the user and calculating a position threshold value according to the touch position of the user; converting a sensing voltage sensed from the actuator in response to the pressure into sensing data and comparing the sensing data with the position threshold value; and applying driving voltages to the actuator to vibrate the actuator when the sensing data is greater than the position threshold value.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are include to provide a further understanding of the invention and are incorporated in and constitute a part of this specification, illustrate exemplary embodiments of the invention, and together with the description serve to explain the inventive concepts.

DETAILED DESCRIPTION

The accompanying drawings, which are included to provide a further understanding of the invention and are incorporated in and constitute a part of this specification, illustrate exemplary embodiments of the invention, and together with the description serve to explain the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
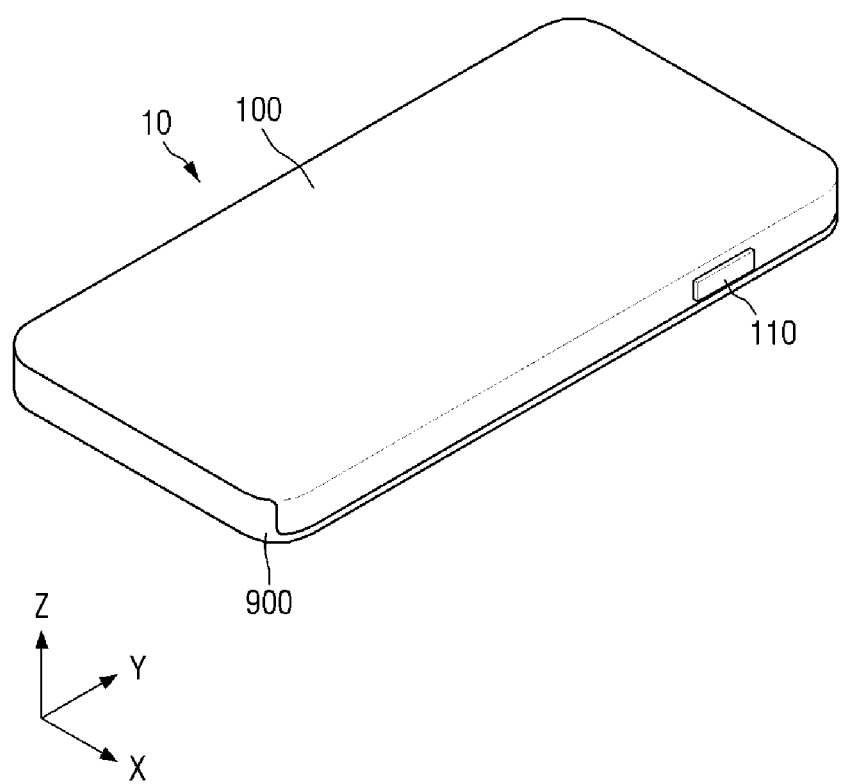
FIG. 1 is a perspective view illustrating a display device according to an exemplary embodiment.
Figure 2:
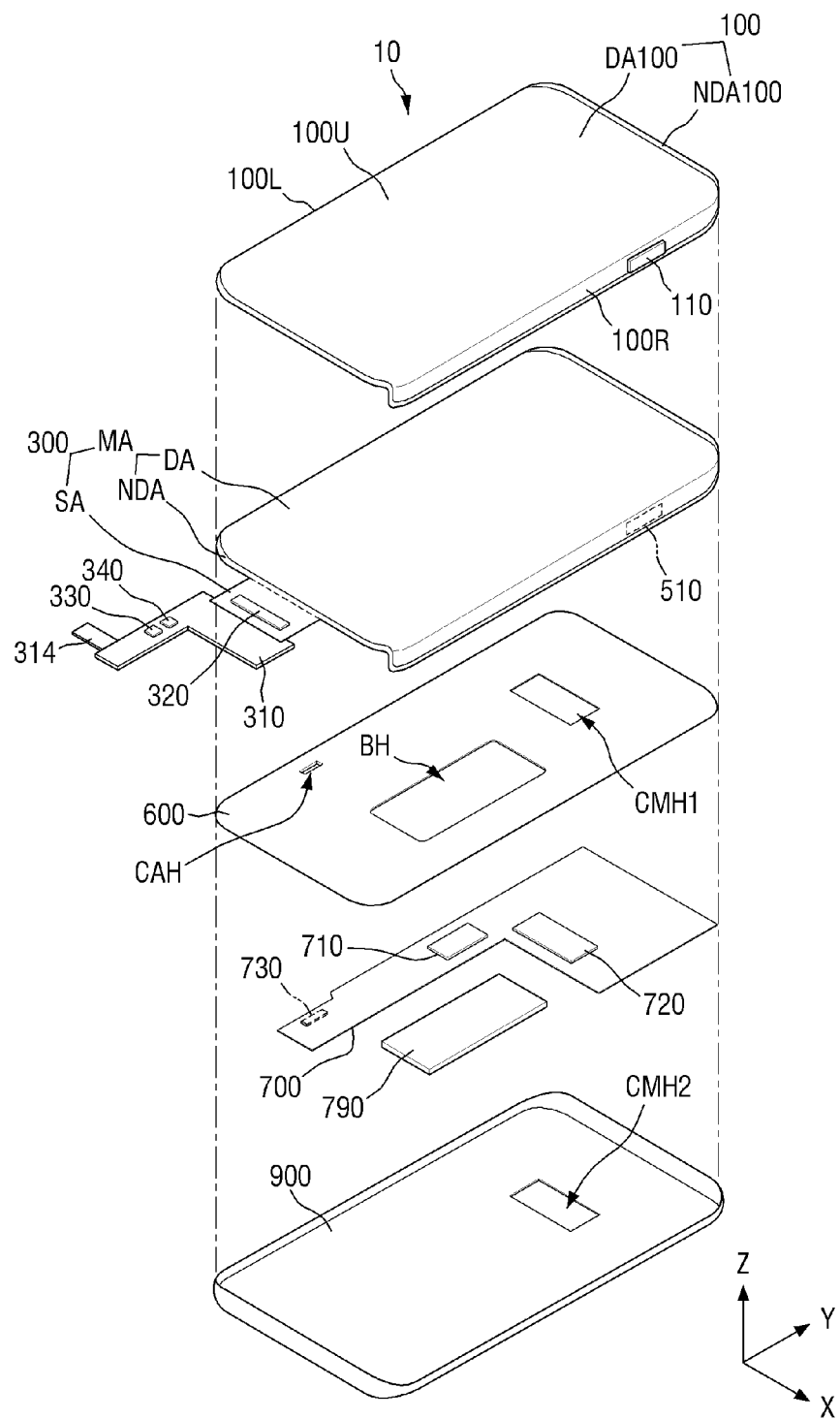
FIG. 2 is an exploded perspective view illustrating the display device in accordance with FIG. 1.

FIG. 1 is a perspective view illustrating a display device 10 according to an exemplary embodiment. FIG. 2 is an exploded perspective view of the display device 10 in accordance with FIG. 1.

The display device 10 according to an exemplary embodiment is a device configured to display moving images or still images. The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards and the Internet of things (IoT). Alternatively, the display device 10 may be used as a display screen applied to a center fascia of a vehicle. Although a case where the display device 10 according to the embodiment is a smartphone is mainly described below, embodiments are not limited to this case.

The display device 10 may be an organic light emitting display device using organic light emitting diodes, a quantum dot light emitting display device including quantum dot light emitting layers, an inorganic light emitting display device including inorganic semiconductors, or a micro light emitting diode display device using micro light emitting diodes. Although a case where the display device 10 is an organic light emitting display device is mainly described below, embodiments are not limited to this case.

Referring to FIGS. 1 and 2, the display device 10 according to the exemplary embodiments includes a cover window 100, a display panel 300, a display circuit board 310, a display driver 320, a bracket 600, a main circuit board 700, and a bottom cover 900.

In the present specification, a first direction (X-axis direction) may be a width direction parallel to short sides of the display device 10 in plan view, for example, a horizontal direction of the display device 10. A second direction (Y-axis direction) may be a length direction parallel to long sides of the display device 10 in plan view, for example, a vertical direction of the display device 10. A third direction (Z-axis direction) may be a thickness direction of the display device 10.

The display device 10 may be rectangular in plan view. For example, the display device 10 may have a rectangular planar shape having short sides in the first direction (X-axis direction) and long sides in the second direction (Y-axis direction) as illustrated in FIGS. 1 and 2. Each corner where a short side extending in the first direction (X-axis direction) meets a long side extending in the second direction (Y-axis direction) may be rounded with a predetermined curvature or may be right-angled. The planar shape of the display device 10 is not limited to the rectangular shape, but may also be another polygonal shape, a circular shape, or an oval shape.

The cover window 100 may be disposed on the display panel 300 to cover an upper surface of the display panel 300. The cover window 100 may function to protect the upper surface of the display panel 300. The cover window 100 may include alight transmitting portion DA100 which transmits light and a light shielding portion NDA100 which blocks light. The light shielding portion NDA100 may include a decorative layer having a predetermined pattern.

The cover window 100 may include an upper surface portion 100U that forms an upper surface of the display device 10, a left side surface portion 100L that forms a left side surface of the display device 10, and a right side surface portion 100R that forms a right side surface of the display device 10. The left side surface portion 100L of the cover window 100 may extend from a left side of the upper surface portion 100U, and the right side surface portion 100R may extend from a right side of the upper surface portion 100U.

The upper surface portion 100U, the left side surface portion 100L and the right side surface portion 100R of the cover window 100 may all include the light transmitting portion DA100 and the light shielding portion NDA100. The light transmitting portion DA100 may occupy most of the upper surface portion 100U, the left side surface portion 100L and the right side surface portion 100R of the cover window 100. The light shielding portion NDA100 may be disposed at an upper edge and a lower edge of the upper surface portion 100U of the cover window 100, at an upper edge, a left edge and a lower edge of the left side surface portion 100L of the cover window 100, and at an upper edge, a right edge and a lower edge of the right side surface portion 100R of the cover window 100.

A tactile pattern 110 may be disposed on the right side surface portion 100R of the cover window 100 as illustrated in FIG. 2. The tactile pattern 110 may be an embossed pattern protruding from the right side surface portion 100R of the cover window 100 or an intaglio pattern cut into the right side surface portion 100R of the cover window 100. The embossed pattern may be a carve, mold, or stamp of a design on the right side surface portion 100R of the cover window 100 so that the embossed pattern stands out in relief. The intaglio pattern may be a design incised or engraved into the right side portion 100R of the cover window 100. The tactile pattern 110 may be a pattern felt by a user as being different from a surface the cover window 100. Therefore, the user may recognize the tactile pattern 110 as a physical button.

The display panel 300 may be disposed under the cover window 100. The display panel 300 may include a main area MA and a sub area SA. The main area MA may include a display area DA in which pixels are formed to display an image and a non-display area NDA located around the display area DA.

The display area DA may occupy most of the main area MA. The display area DA may be disposed at a center of the main area MA.

The non-display area NDA may be an area outside the display area DA. The non-display area NDA may be defined as an edge area of the display panel 300.

The sub area SA may protrude in the second direction (Y-axis direction) from a side of the main area MA. As illustrated in FIG. 2, a length of the sub area SA in the first direction (X-axis direction) may be smaller than a length of the main area MA in the first direction (X-axis direction), and a length of the sub area SA in the second direction (Y-axis direction) may be smaller than a length of the main area MA in the second direction (Y-axis direction). However, embodiments are not limited to this case.

Figure 3:
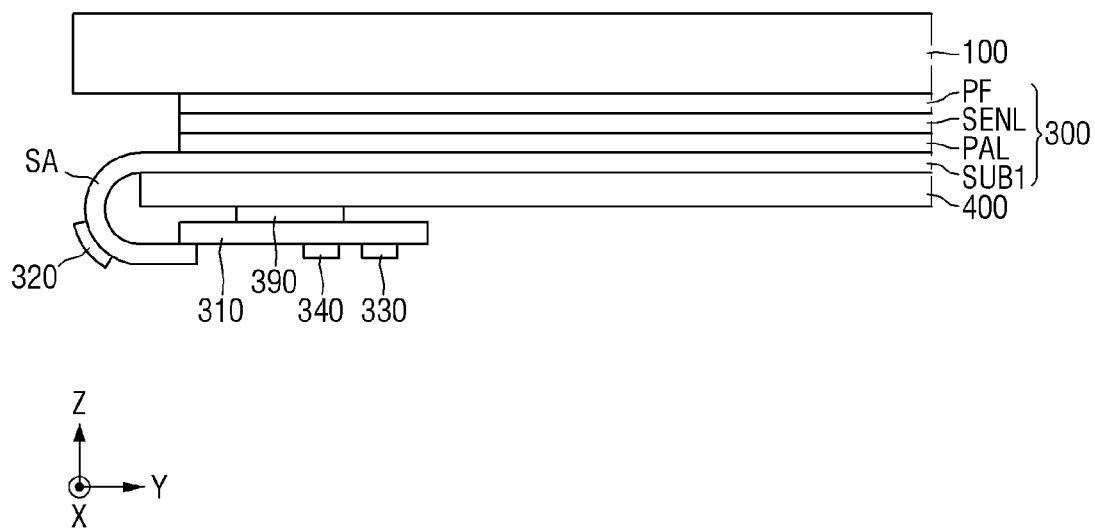
FIG. 3 is a cross-sectional view illustrating a side of a display panel of the display device in accordance with FIG. 1.

The sub area SA may be bendable and may be disposed on a lower surface of the display panel 300 as illustrated in FIG. 3. The sub area SA may overlap the main area MA in the third direction (Z-axis direction). In the sub area SA, display pads (not illustrated) and the display driver 200 320 be disposed.

The display area DA of the display panel 300 may be overlapped by the light transmitting portion DA100 of the cover window 100 in the thickness direction (Z-direction) of the display panel 300. The non-display area NDA of the display panel 300 may be overlapped by the light shielding portion NDA100 of the cover window 100 in the thickness direction (Z-direction) of the display panel 300.

The display panel 300 may include an upper surface portion corresponding to the upper surface portion of the cover window 100, a left side surface portion corresponding to the left side surface portion of the cover window 100, and a right side surface portion corresponding to the right side surface portion of the cover window 100. The left side surface portion of the display panel 300 may extend from a left side of the upper surface portion, and the right side surface portion of the display panel 300 may extend from a right side of the upper surface portion.

The upper surface portion, the left side surface portion and the right side surface portion of the display panel 300 may all include the display area DA and the non-display area NDA. The display area DA may occupy most of the upper surface portion, the left side surface portion and the right side surface portion of the display panel 300. The non-display area NDA may be disposed at an upper edge and a lower edge of the upper surface portion of the display panel 300, at an upper edge, a left edge and a lower edge of the left side surface portion of the display panel 300, and at an upper edge, a right edge and a lower edge of the right side surface portion of the display panel 300.

An actuator 510 may be disposed on a lower surface of the right side surface portion of the display panel 300. The actuator 510 may be attached to the lower surface of the right side surface portion of the display panel 300 using an adhesive member such as a pressure sensitive adhesive (PSA). The actuator 510 may be a piezoelectric element or a piezoelectric actuator including a piezoelectric material that has a piezoelectric effect in which a voltage is generated in response to applied mechanical pressure and has an inverse piezoelectric effect in which mechanical deformation occurs in response to an applied voltage.

Figure 4:
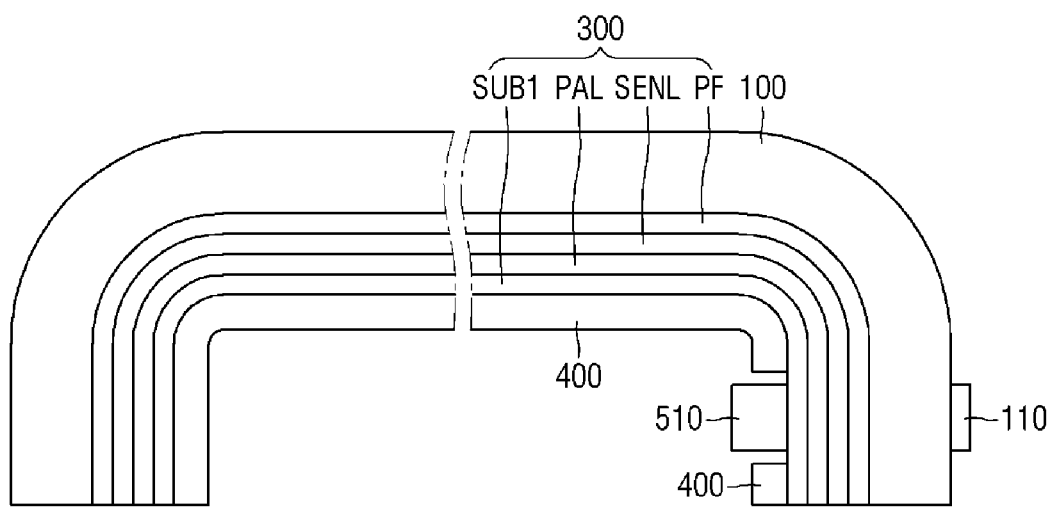
FIG. 4 is a cross-sectional view illustrating the other side of the display panel of the display device in accordance with FIG. 1.

The actuator 510 may overlap the tactile pattern 110 of the cover window 100 in the width direction (X-direction) of the display panel 300 as illustrated in FIGS. 2 and 4. Therefore, when a user applies pressure to the tactile pattern 110 with a finger, the pressure may be applied to the actuator 510. For example, when the user applies pressure to the tactile pattern 110 by recognizing the tactile pattern 110 as a physical button, the actuator 510 may generate a voltage due to the piezoelectric effect. In addition, when the actuator 510 generates vibrations due to mechanical deformation of the inverse piezoelectric effect, the vibrations may be transmitted to the user's finger touching the tactile pattern 110. Therefore, the user may feel haptic feedback.

The display circuit board 310 and the display driver 320 may be attached to the subarea SA of the display panel 300. An end of the display circuit board 310 may be attached onto display pads (not illustrated) disposed at a lower edge of the sub area SA of the display panel 300 by using an anisotropic conductive film. The display circuit board 310 may be a flexible printed circuit board that can be bent, a rigid printed circuit board that is rigid and not easily bent, or a composite printed circuit board including both a rigid printed circuit board and a flexible printed circuit board.

The display driver 320 receives control signals and power supply voltages through the display circuit board 310 and generates and outputs signals and voltages configured to drive the display panel 300. The display driver 320 may be formed as an integrated circuit and attached to the sub area SA of the display panel 300 using a chip-on glass (COG) method, a chip-on plastic (COP) method, or an ultrasonic method. However, embodiments are not limited to this case. For example, the display driver 320 may be attached onto the display circuit board 310.

A sensor driver 330 and an actuator driver 340 may be disposed on the display circuit board 310. The sensor driver 330 and the actuator driver 340 may be formed as integrated circuits.

The sensor driver 330 may be attached to an upper surface of the display circuit board 310. The sensor driver 330 may be electrically connected to sensor electrodes of a sensor electrode layer of the display panel 300 through the display circuit board 310. The sensor driver 330 may transmit touch driving signals to driving electrodes among the sensor electrodes and determine a touch or proximity of a user by detecting amounts of charge change in capacitances between the driving electrodes and sensing electrodes among the sensor electrodes through the sensing electrodes. The touch of the user indicates that an object such as a finger of the user or a pen directly touches an upper surface of the cover window 100 disposed on the sensor electrode layer. The proximity of the user indicates that an object such as a finger of the user or a pen hovers above the upper surface of the cover window 100. The sensor driver 330 may output touch data including touch coordinates of the user to a main processor 710.

The actuator driver 340 may be attached to the upper surface of the display circuit board 310. The actuator driver 340 may be electrically connected to the actuator 510. A connection member may be disposed to connect the display circuit board 310 and the actuator 510. The connection member may be a flexible printed circuit board or a flexible cable.

When the actuator 510 generates a voltage due to the piezoelectric effect, the actuator driver 340 may sense the voltage through the connection member. The actuator driver 340 may determine whether pressure has been applied to the actuator 510 by comparing the sensed voltage with a threshold voltage.

In addition, the actuator driver 340 may generate driving voltages according to driving data input from the main processor 710 of the main circuit board 700 to vibrate the actuator 510 through the inverse piezoelectric effect and may output the driving voltages to the actuator 510. The driving voltages may be applied as sine waves or square waves. Here, when the driving voltages are applied as square waves, a user can clearly receive different haptic feedback even if the different haptic feedback is successively implemented using the actuator 510.

The bracket 600 may be disposed under the display panel 300. The bracket 600 may include plastic, metal, or both plastic and metal. The bracket 600 may include a first camera hole CMH1 into which a camera device 720 is inserted, a battery hole BH in which a battery 790 is disposed, and a cable hole CAH through which a cable 314 connected to the display circuit board 310 passes.

The main circuit board 700 and the battery 790 may be disposed under the bracket 600. The main circuit board 700 may be a printed circuit board or a flexible printed circuit board.

The main circuit board 700 may include the main processor 710, the camera device 720, and a main connector 730. The main processor 710 may be formed as an integrated circuit.

The camera device 720 may be disposed on both upper and lower surfaces of the main circuit board 700, the main processor 710 may be disposed on the upper surface of the main circuit board 700, and the main connector 730 may be disposed on the lower surface of the main circuit board 700.

The main processor 710 may control all the functions of the display device 10. For example, the main processor 710 may output digital video data to the display driver 320 through the display circuit board 310 so that the display panel 300 can display an image. In addition, the main processor 710 may receive touch data including touch coordinates of a user from the sensor driver 330, determine a touch or proximity of the user, and then perform an operation corresponding to the touch input or proximity input of the user. For example, the main processor 710 may execute an application indicated by an icon touched by the user or may perform an operation.

When the main processor 710 determines that pressure has been applied from the actuator 510 by the actuator driver 340, it may provide haptic feedback to a user by using the actuator 510. When determining that pressure has been applied from the actuator 510 by the actuator driver 340, the main processor 710 may receive pre-stored driving data from a memory and output the driving data to the actuator driver 340.

The main processor 710 may be an application processor, a central processing unit, or a system chip formed as an integrated circuit.

The camera device 720 may process an image frame such as a still image or a moving image obtained by an image sensor in a camera mode and output the processed image frame to the main processor 710.

The cable 314 passing through the cable hole CAH of the bracket 600 may be connected to the main connector 730. Therefore, the main circuit board 700 may be electrically connected to the display circuit board 310.

The battery 790 may be disposed not to overlap the main circuit board 700 in the third direction (Z-axis direction). The battery 790 may be overlapped by the battery hole BH of the bracket 600 in the third direction (Z-axis direction).

In addition, the main circuit board 700 may further include a mobile communication module capable of transmitting or receiving a wireless signal to or from at least one of a base station, an external terminal, and a server over a mobile communication network. The wireless signal may include a voice signal, a video call signal, or various types of data according to transmission/reception of text/multimedia messages.

The bottom cover 900 may be disposed under the main circuit board 700 and the battery 790. The bottom cover 900 may be fastened and fixed to the bracket 600. The bottom cover 900 may form an upper side surface, a lower side surface and a lower surface of the display device 10. The bottom cover 900 may include plastic, metal, or both plastic and metal.

A second camera hole CMH2 exposing a lower surface of the camera device 720 may be formed in the bottom cover 900. The position of the camera device 720 and the positions of the first and second camera holes CMH1 and CMH2 corresponding to the camera device 720 are not limited to the embodiment illustrated in FIG. 2.

FIG. 3 is a cross-sectional view of a lower side of a display module of the display device 10 according to the embodiment. FIG. 4 is a cross-sectional view of the other upper side of the display module of the display device 10 according to the embodiment.

Referring to FIGS. 3 and 4, the display panel 300 may include a substrate SUB1, a display layer PAL, and a sensor electrode layer SENL.

The substrate SUB1 may be made of an insulating material such as glass, quartz, or polymer resin. The substrate SUB1 may be a rigid substrate or a flexible substrate that can be bent, folded, and rolled. The display layer PAL and the sensor electrode layer SENL may be disposed on the main area MA of the substrate SUB1. The subarea SA of the substrate SUB1 may be bent onto the lower surface of the display panel 300 and attached to a lower surface of an bottom panel cover 400 by an adhesive member 390.

Figure 5:
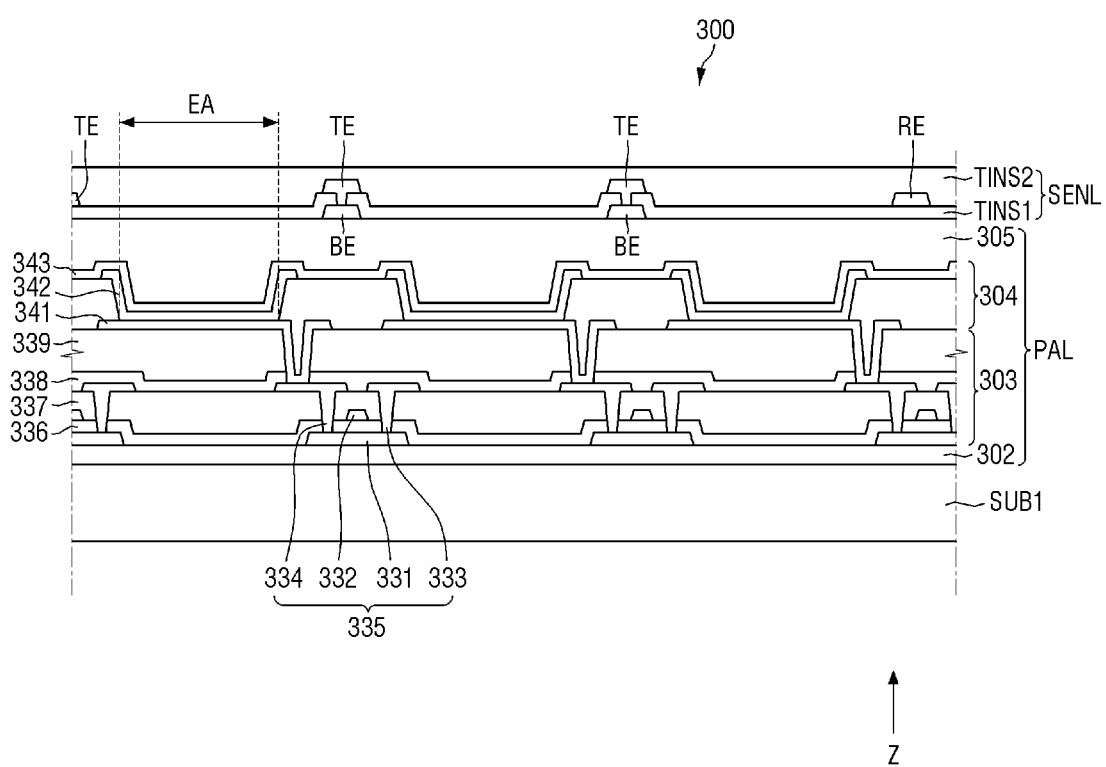
FIG. 5 is a cross-sectional view illustrating a display unit of the display panel in accordance with exemplary embodiments.

The display layer PAL may be disposed on the substrate SUB1. The display layer PAL may be a layer including pixels to display an image. As illustrated in FIG. 5, the display layer PAL may include a buffer layer 302, a thin-film transistor layer 303, a light emitting element layer 304, and an encapsulation layer 305.

The sensor electrode layer SENL may be disposed on the display layer PA1. The sensor electrode layer SENL may include sensor electrodes and may be a layer configured to sense a user's touch.

A polarizing film PF (illustrated in FIGS. 3 and 4) may be disposed on the sensor electrode layer SENL to prevent a decrease in visibility due to reflection of external light. The polarizing film PF may include a linear polarizer and a retardation film such as a quarter-wave ($\lambda/4$) plate. The retardation film may be disposed on the sensor electrode layer SENL, and the linear polarizer may be disposed on the retardation film.

The cover window 100 may be disposed on the polarizing film PF. The cover window 100 may be made of a transparent material and may include glass or plastic. For example, the cover window 100 may include ultra-thin glass (UTG) having a thickness of 0.1 mm or less. The cover window 100 may include a transparent polyimide film. The cover window 100 may be attached onto the polarizing film PF by a transparent adhesive member such as an optically clear adhesive (OCA) film.

The bottom panel cover 400 may be disposed under the substrate SUB1. The bottom panel cover 400 may be attached to a lower surface of the substrate SUB1 by an adhesive member. The adhesive member may be a PSA. The bottom panel cover 400 may include at least one of a light absorbing member configured to absorb light incident from the outside, a buffer member configured to absorb external impact, and a heat dissipating member configured to efficiently dissipate the heat of the display panel 300.

The light absorbing member (not illustrated) may be disposed under the display panel 300. The light absorbing member blocks transmission of light to prevent elements disposed under the light absorbing member, for example, the display circuit board 310, etc. from being seen from above the display panel 300. The light absorbing member may include a light absorbing material such as a black pigment or dye.

The buffer member (not illustrated) may be disposed under the light absorbing member. The buffer member absorbs external impact to prevent the display panel 300 from being damaged. The buffer member may be composed of a single layer or a plurality of layers. For example, the buffer member may be made of polymer resin such as polyurethane, polycarbonate, polypropylene or polyethylene or may be made of an elastic material such as sponge formed by foaming rubber, a urethane-based material or an acrylic-based material.

The heat dissipating member (not illustrated) may be disposed under the buffer member. The heat dissipating member may include a first heat dissipating layer containing graphite or carbon nanotubes and a second heat dissipating layer formed of a metal thin film (such as copper, nickel, ferrite or silver) capable of shielding electromagnetic waves and having excellent thermal conductivity.

When the actuator 510 is disposed on the heat dissipating member of the bottom panel cover 400, a first heat dissipating layer (not illustrated) of the heat dissipating member may be broken by the vibration of the actuator 510. Therefore, the heat dissipating member of the bottom panel cover 400 may be removed from an area where the actuator 510 is disposed, and the actuator 510 may be attached to a lower surface of the buffer member of the bottom panel cover 400.

Alternatively, when the actuator 510 is disposed on the buffer member of the bottom panel cover 400, the magnitude of vibration of the actuator 510 may be reduced by the buffer member. Therefore, the buffer member and the heat dissipating member may be removed from the area where the actuator 510 is disposed, and the actuator 510 may be attached to a lower surface of the light absorbing member.

Alternatively, as illustrated in FIG. 4, the bottom panel cover 400 may be removed from the area where the actuator 510 is disposed, and the actuator 510 may be attached to the lower surface of the substrate SUB1 of the display panel 300. That is, the actuator 510 and the bottom panel cover 400 may not overlap each other in the width direction of the display panel 300.

FIG. 5 is a detailed cross-sectional view of the display layer PAL and the sensor electrode layer SENL of the display panel 300 according to an exemplary embodiment.

Referring to FIG. 5, the display panel 300 may include the substrate SUB1, the display layer PAL, and the sensor electrode layer SENL. The display layer PAL may include the buffer layer 302, the thin-film transistor layer 303, the light emitting element layer 304, and the encapsulation layer 305.

The buffer layer 302 may be formed on the substrate SUB1. The buffer layer 302 may be formed on the substrate SUB1 to protect thin-film transistors 335 and light emitting elements from moisture introduced through the substrate SUB1 which is vulnerable to moisture penetration. The buffer layer 302 may be composed of a plurality of inorganic layers stacked alternately. For example, the buffer layer 302 may be a multilayer in which one or more inorganic layers selected from a silicon oxide ($SiO_x$) layer, a silicon nitride ($SiN_x$) layer, and SiON are alternately stacked. The buffer layer 302 can be omitted.

The thin-film transistor layer 303 is formed on the buffer layer 302. The thin-film transistor layer 303 includes the thin-film transistors 335, a gate insulating layer 336, an interlayer insulating film 337, a protective layer 338, and an organic layer 339.

Each of the thin-film transistors 335 includes an active layer 331, a gate electrode 332, a source electrode 333, and a drain electrode 334. In FIG. 5, each of the thin-film transistors 335 is formed as a top-gate type in which the gate electrode 332 is located above the active layer 331. However, it should be noted that embodiments are not limited to this case. That is, each of the thin-film transistors 335 may also be formed as a bottom-gate type in which the gate electrode 332 is located under the active layer 331 or a double-gate type in which the gate electrode 332 is located both above and under the active layer 331.

The active layers 331 are formed on the buffer layer 302. The active layers 331 may be made of a silicon-based semiconductor material or an oxide-based semiconductor material. For example, the active layers 331 may be made of polysilicon, amorphous silicon, or an oxide semiconductor. A light shielding layer may be formed between the buffer layer 302 and the active layers 331 to block external light from entering the active layers 331.

The gate insulating layer 336 may be formed on the active layers 331. The gate insulating layer 336 may be an inorganic layer, for example, a silicon oxide ($SiO_x$) layer, a silicon nitride ($SiN_x$) layer, or a multilayer composed of these layers.

The gate electrodes 332 may be formed on the gate insulating layer 336. Each of the gate electrodes 332 and the gate lines may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The interlayer insulating film 337 may be formed on the gate electrodes 332 and the gate lines. The interlayer insulating film 337 may be an inorganic layer, for example, a silicon oxide ($SiO_x$) layer, a silicon nitride ($SiN_x$) layer, or a multilayer composed of these layers.

The source electrodes 333 and the drain electrodes 334 may be formed on the interlayer insulating film 337. Each of the source electrodes 333 and the drain electrodes 334 may be connected to an active layer 331 through a contact hole passing through the gate insulating layer 336 and the interlayer insulating film 337. Each of the source electrodes 333 and the drain electrodes 334 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The protective layer 338 configured to insulate the thin-film transistors 335 may be formed on the source electrodes 333 and the drain electrodes 334. The protective layer 338 may be an inorganic layer, for example, a silicon oxide ($SiO_x$) layer, a silicon nitride ($SiN_x$) layer, or a multilayer composed of these layers.

The organic layer 339 may be formed on the protective layer 338 to planarize steps due to the thin-film transistors 335. The organic layer 339 may be made of an organic layer such as acryl resin, epoxy resin, phenolic resin, polyamide resin, or polyimide resin.

The light emitting element layer 304 is formed on the thin-film transistor layer 303. The light emitting element layer 304 includes the light emitting elements and a bank 344.

The light emitting elements and the bank 344 are formed on the organic layer 339. The light emitting elements may be organic light emitting devices, each including an anode 341, a light emitting layer 342, and a cathode 343.

The anodes 341 may be formed on the organic layer 339. The anodes 341 may be connected to the source electrodes 333 or the drain electrodes 334 of the thin-film transistors 335 through contact holes passing through the protective layer 338 and the organic layer 339.

The bank 344 may be formed on the organic layer 339 and may cover edges of the anodes 341 to define light emitting areas EA of pixels PX. That is, the bank 344 defines the light emitting areas EA of the pixels PX. Each of the pixels PX is an area in which the anode 341, the light emitting layer 342 and the cathode 343 are sequentially stacked so that holes from the anode 341 and electrons from the cathode 343 combine together in the light emitting layer 342 to emit light.

The light emitting layers 342 are formed on the anodes 341 and the bank 344. The light emitting layers 342 may be organic light emitting layers. Each of the light emitting layers 342 may emit one of red light, green light, and blue light. Alternatively, the light emitting layers 342 may be white light emitting layers which emit white light. In this case, the light emitting layers 342 may be a stack of a red light emitting layer, a green light emitting layer and a blue light emitting layer and may be a common layer common to all of the pixels PX. In this case, the display panel 300 may further include color filters configured to display red, green and blue.

Each of the light emitting layers 342 may include a hole transporting layer, an emitting layer, and an electron transporting layer. In addition, each of the light emitting layers 342 may be formed in a tandem structure of two or more stacks, in which case a charge generating layer may be formed between the stacks.

The cathode 343 is formed on the light emitting layers 342. The cathode 343 may be formed to cover the light emitting layers 342. The cathode 343 may be a common layer common to all of the pixels PX.

When the light emitting element layer 304 is formed as a top emission type which emits light in an upward direction, the anodes 341 may be made of a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu). In addition, the cathode 343 may be made of a transparent conductive material (TCO) capable of transmitting light, such as indium tin oxide (ITO) or indium zinc oxide (IZO), or a semi-transmissive conductive material such as magnesium (Mg), silver (Ag) or an alloy of Mg and Ag. When the cathode 343 is made of a semi-transmissive conductive material, the light output efficiency may be increased by a microcavity.

When the light emitting element layer 304 is formed as a bottom emission type which emits light in a downward direction, the anodes 341 may be made of a transparent conductive material (TCO) such as indium tin oxide (ITO) or indium zinc oxide (IZO) or a semi-transmissive conductive material such as magnesium (Mg), silver (Ag) or an alloy of Mg and Ag. The cathode 343 may be made of a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. When the anodes 341 are made of a semi-transmissive conductive material, the light output efficiency may be increased by a microcavity.

The encapsulation layer 305 is formed on the light emitting element layer 304. The encapsulation layer 305 serves to prevent oxygen or moisture from penetrating into the light emitting layers 342 and the cathode 343. To this end, the encapsulation layer 305 may include at least one inorganic layer. The inorganic layer may be made of silicon nitride, aluminum nitride, zirconium nitride, titanium nitride, hafnium nitride, tantalum nitride, silicon oxide, aluminum oxide, or titanium oxide. In addition, the encapsulation layer 305 may further include at least one organic layer. The organic layer may be formed to a sufficient thickness so as to prevent particles from penetrating the encapsulation layer 305 and entering the light emitting layers 342 and the cathode 343. The organic layer may include any one of epoxy, acrylate, and urethane acrylate.

The sensor electrode layer SENL may be formed on the encapsulation layer 305. When the sensor electrode layer SENL is formed directly on the encapsulation layer 305, a thickness of the display device 10 can be reduced as compared with when a separate touch panel is attached onto the encapsulation layer 305.

The sensor electrode layer SENL may include sensor electrodes configured to sense a user's touch using a capacitance method and touch lines configured to connect pads and the sensor electrodes. For example, the sensor electrode layer SENL may sense a user's touch using a self-capacitance method or a mutual capacitance method. In FIG. 5, a case where the sensor electrode layer SENL is a double layer formed using the mutual capacitance method and including driving electrodes TE, sensing electrodes RE and connecting portions BE connecting the driving electrodes TE is mainly described.

The connecting portions BE may be formed on the encapsulation layer 305. The connecting portions BE may be made of, but are not limited to, a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. For example, each of the connecting portions BE may be formed as a single layer of molybdenum (Mo), titanium (Ti), copper (Cu), aluminum (Al), or indium tin oxide (ITO).

A first sensing insulating layer TINS1 is formed on the connecting portions BE. The first sensing insulating layer TINS1 may be made of an inorganic layer, for example, a silicon nitride layer, a silicon oxynitride layer, a silicon oxide layer, a titanium oxide layer, or an aluminum oxide layer.

The driving electrodes TE and the sensing electrodes RE may be formed on the first sensing insulating layer TINS1. The driving electrodes TE and the sensing electrodes RE may be made of, but are not limited to, a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. For example, each of the driving electrodes TE and the sensing electrodes RE may be formed as a single layer of molybdenum (Mo), titanium (Ti), copper (Cu), aluminum (Al), or indium tin oxide (ITO).

Contact holes penetrating the first sensing insulating layer TINS1 to expose the connecting portions BE may be formed in the first sensing insulating layer TINS1. The driving electrodes TE may be connected to the connecting portions BE through the contact holes.

A second sensing insulating layer TINS2 is formed on the driving electrodes TE and the sensing electrodes RE. The second sensing insulating layer TINS2 may planarize steps formed by the driving electrodes TE, the sensing electrodes RE, and the connecting portions BE. The second sensing insulating layer TINS2 may be made of an organic layer such as acryl resin, epoxy resin, phenolic resin, polyamide resin, or polyimide resin.

The connecting portions BE connecting adjacent driving electrodes TE may be disposed on the encapsulation layer 305, and the driving electrodes TE and the sensing electrodes RE may be disposed on the first sensing insulating layer TINS1. Therefore, the driving electrodes TE and the sensing electrodes RE may be electrically insulated at their intersections. The sensing electrodes RE may be electrically connected in one direction, and the driving electrodes TE may be electrically connected in the other direction.

Figure 6:
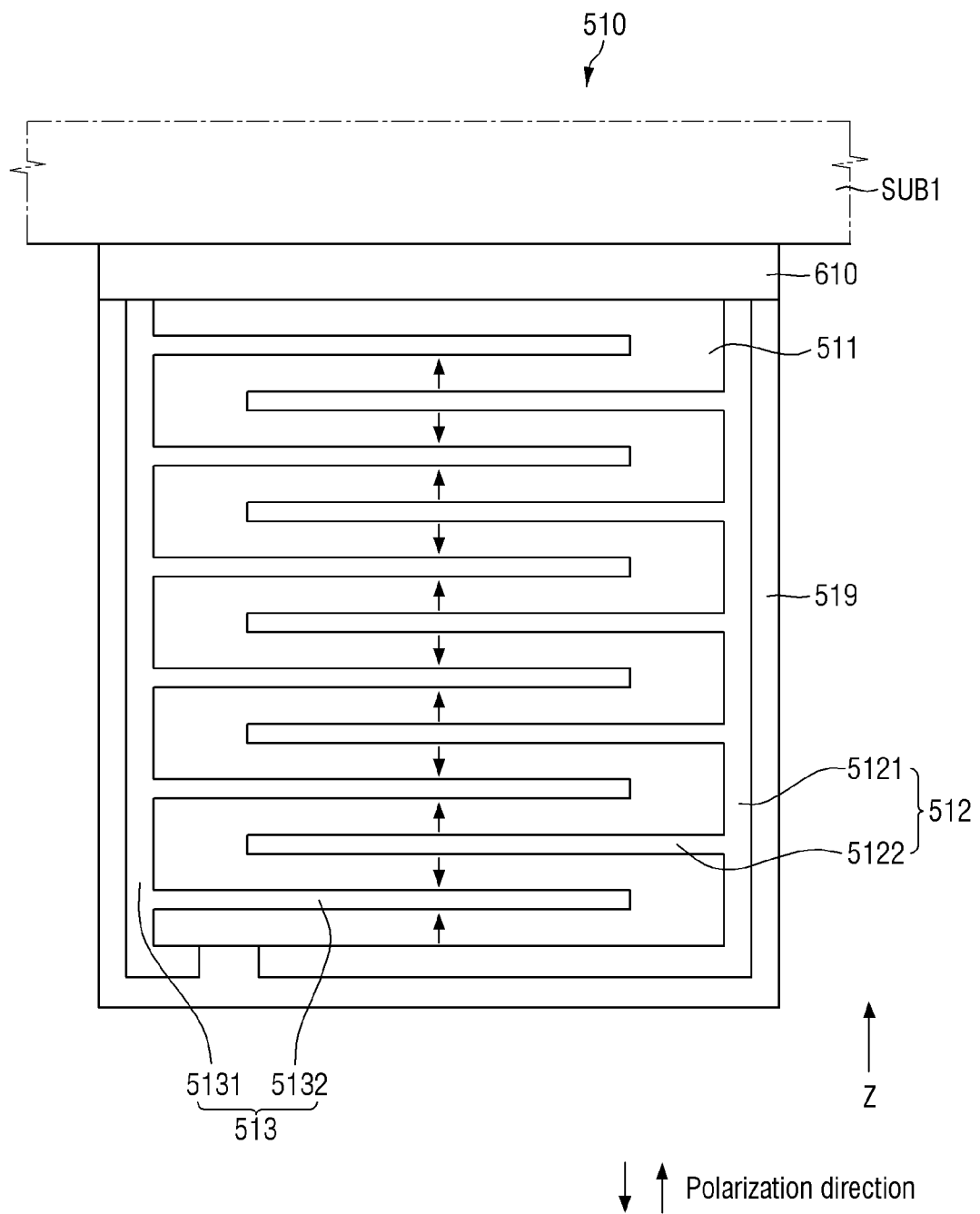
FIG. 6 is a view illustrating an actuator according to an exemplary embodiment.
Figure 7:
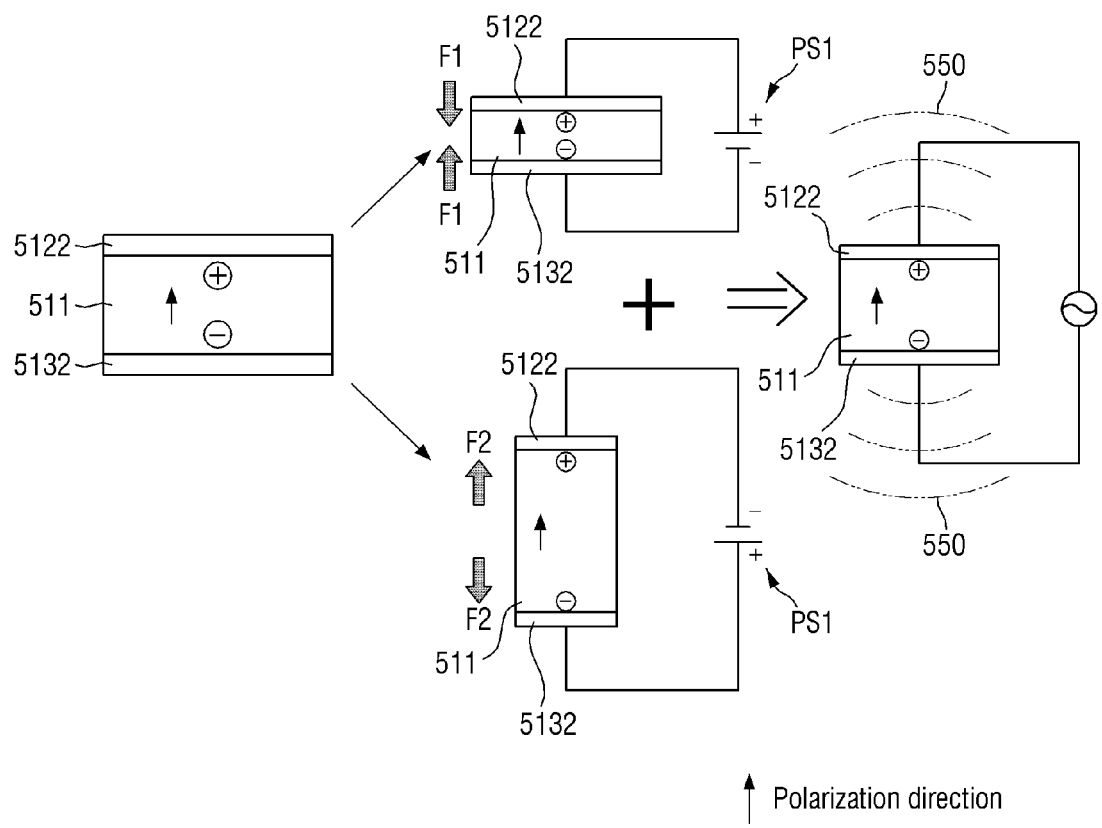
FIG. 7 is a diagram illustrating an inverse piezoelectric effect of the actuator in accordance with FIG. 6.
Figure 8:
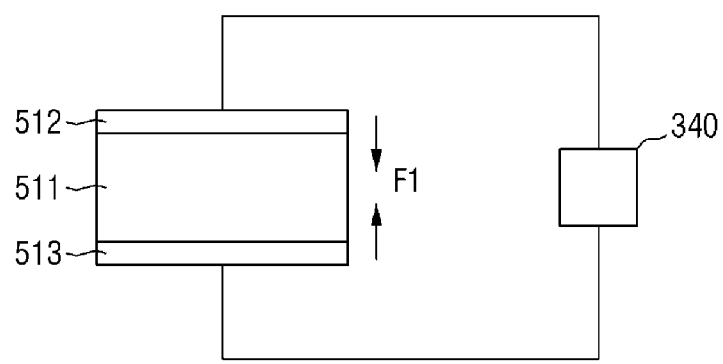
FIG. 8 is a diagram illustrating a piezoelectric effect of the actuator in accordance with FIG. 6.

FIG. 6 is a detailed view of an actuator 510 according to an exemplary embodiment. FIG. 7 is a diagram illustrating the inverse piezoelectric effect of the actuator 510 in accordance with FIG. 6. FIG. 8 is a diagram illustrating the piezoelectric effect of the actuator 510 in accordance with FIG. 6.

Referring to FIGS. 6 through 8, the actuator 510 may be a piezoelectric element or a piezoelectric actuator that vibrates the display panel 300 using a piezoelectric material that contracts or expands according to an applied voltage. The actuator 510 may include a vibration layer 511, a first electrode 512, and a second electrode 513.

The first electrode 512 may include a first stem electrode 5121 and first branch electrodes 5122. The first stem electrode 5121 may be disposed on at least one side surface of the vibration layer 511 as illustrated in FIG. 6. Alternatively, the first stem electrode 5121 may penetrate a part of the vibration layer 511. The first stem electrode 5121 may also be disposed on an upper surface of the vibration layer 511. The first branch electrodes 5122 may branch from the first stem electrode 5121. The first branch electrodes 5122 may be arranged parallel to each other.

The second electrode 513 may include a second stem electrode 5131 and second branch electrodes 5132. The second electrode 513 may be spaced apart from the first electrode 512. Therefore, the second electrode 513 may be electrically insulated from the first electrode 512 by the vibration layer 511. The second stem electrode 5131 may be disposed on at least one side surface of the vibration layer 511. In this case, the first stem electrode 5121 may be disposed on a first side surface of the vibration layer 511, and the second stem electrode 5131 may be disposed on a second side surface of the vibration layer 511. Alternatively, the second stem electrode 5131 may penetrate a part of the vibration layer 511. The second stem electrode 5131 may be disposed on the upper surface of the vibration layer 511. The second branch electrodes 5132 may branch from the second stem electrode 5131. The second branch electrodes 5132 may be arranged parallel to each other.

The first branch electrodes 5122 and the second branch electrodes 5132 may be arranged parallel to each other in the horizontal direction (X-axis direction or Y-axis direction). In addition, the first branch electrodes 5122 and the second branch electrodes 5132 may be alternately arranged in the vertical direction (Z-axis direction). That is, the first branch electrodes 5122 and the second branch electrodes 5132 may be repeatedly arranged in the vertical direction (Z-axis direction) in the order of the first branch electrode 5122, the second branch electrode 5132, the first branch electrode 5122, and the second branch electrode 5132.

The first electrode 512 and the second electrode 513 may be connected to pads of a flexible circuit board. The pads of the flexible circuit board may be connected to the first electrode 512 and the second electrode 513 exposed on a surface of the actuator 510.

The vibration layer 511 may be a piezoelectric element that is deformed according to a driving voltage applied to the first electrode 512 and a driving voltage applied to the second electrode 513. In this case, the vibration layer 511 may be anyone of a piezoelectric material, such as a polyvinylidene fluoride (PVDF) film or plumbum ziconate titanate (PZT), and an electroactive polymer.

Because a production temperature of the vibration layer 511 is high, the first electrode 512 and the second electrode 513 may be made of silver (Ag) having a high melting point or an alloy of Ag and palladium (Pd). When the first electrode 512 and the second electrode 513 are made of an alloy of Ag and Pd, the Ag content may be higher than the Pd content in order to raise melting points of the first electrode 512 and the second electrode 513.

The vibration layer 511 may be disposed between each pair of the first and second branch electrodes 5122 and 5132. The vibration layer 511 may contractor expand according to a difference between the driving voltage applied to each first branch electrode 5122 and the driving voltage applied to a corresponding second branch electrode 5132.

As illustrated in FIG. 6, when a polarization direction of the vibration layer 511 disposed between a first branch electrode 5122 and a second branch electrode 5132 disposed under the first branch electrode 5122 is an upward direction (↑), the vibration layer 511 may have a positive polarity in an upper area adjacent to the first branch electrode 5122 and a negative polarity in a lower area adjacent to the second branch electrode 5132. In addition, when the polarization direction of the vibration layer 511 disposed between a second branch electrode 5132 and a first branch electrode 5122 disposed under the second branch electrode 5132 is a downward direction (↓), the vibration layer 511 may have a negative polarity in an upper area adjacent to the second branch electrode 5132 and a positive polarity in a lower area adjacent to the first branch electrode 5122. The polarization direction of the vibration layer 511 may be determined by a poling process in which an electric field is applied to the vibration layer 511 using a first branch electrode 5122 and a second branch electrode 5132.

As illustrated in FIG. 7, when the polarization direction of the vibration layer 511 disposed between a first branch electrode 5122 and a second branch electrode 5132 disposed under the first branch electrode 5122 is the upward direction (↑), if a positive driving voltage is applied from a power source PSi to the first branch electrode 5122 and a negative driving voltage is applied from the power source PSi to the second branch electrode 5132, the vibration layer 511 may contract according to a first force F1. The first force F1 may be a contractile force. Also, if a negative driving voltage is applied from the power source PS1 to the first branch electrode 5122 and a positive driving voltage is applied from the power source PS1 to the second branch electrode 5132, the vibration layer 511 may expand according to a second force F2. The second force F2 may be a stretching force.

As illustrated in FIG. 7B, when the polarization direction of the vibration layer 511 disposed between a second branch electrode 5132 and a first branch electrode 5122 disposed under the second branch electrode 5132 is the downward direction (↓), if a positive driving voltage is applied to the second branch electrode 5132 and a negative driving voltage is applied to the first branch electrode 5122, the vibration layer 511 may expand according to a stretching force. Also, if a negative driving voltage is applied to the second branch electrode 5132 and a positive driving voltage is applied to the first branch electrode 5122, the vibration layer 511 may contract according to a contractile force.

When the driving voltage applied to the first electrode 512 and the driving voltage applied to the second electrode 513 repeatedly alternate between the positive polarity and the negative polarity, the vibration layer 511 may repeatedly contract and expand, thus causing the actuator 510 to vibrate as illustrated by vibration lines 550. Because the actuator 510 is disposed on a surface of the substrate SUB1, when the vibration layer 511 of the actuator 510 contracts and expands, the display panel 300 may vibrate in the third direction (Z-axis direction), which is the thickness direction of the display panel 300, as well as the width direction (X-direction), due to stress. As the display panel 300 is vibrated by the actuator 510, sound may be output.

A protective layer 519 may be additionally disposed on a lower surface and side surfaces of the actuator 510. The protective layer 519 may be made of an insulating material or the same material as the vibration layer 511. The protective layer 519 may be disposed on the first electrode 512, the second electrode 513, and the vibration layer 511 and may be exposed without being covered by the first electrode 512 and the second electrode 513. The protective layer 519 may be disposed to surround the first electrode 512, the second electrode 513, and the vibration layer 511 and may be exposed without being covered by the first electrode 512 and the second electrode 513. Therefore, the vibration layer 511, the first electrode 512 and the second electrode 513 of the actuator 510 may be protected by the protective layer 519, but embodiments are not limited thereto. In some embodiments, the protective layer 519 may be omitted.

In addition, as illustrated in FIG. 8, when mechanical deformation occurs in the actuator 510 due to pressure applied to the actuator 510, the vibration layer 511 of the actuator 510 may contract according to a force F1 resulting from the applied pressure. Accordingly, a voltage may be generated in at least any one of the first electrode 512 and the second electrode 513. When a voltage is generated in at least any one of the first electrode 512 and the second electrode 513, the actuator driver 340 may sense the voltage.

As illustrated in FIGS. 6 through 8, the actuator 510 may generate a sensing voltage in at least any one of the first electrode 512 and the second electrode 513 due to the piezoelectric effect when pressure is applied by a user and may generate vibrations due to the inverse piezoelectric effect when a driving voltage is applied to each of the first electrode 512 and the second electrode 513.

Figure 9:
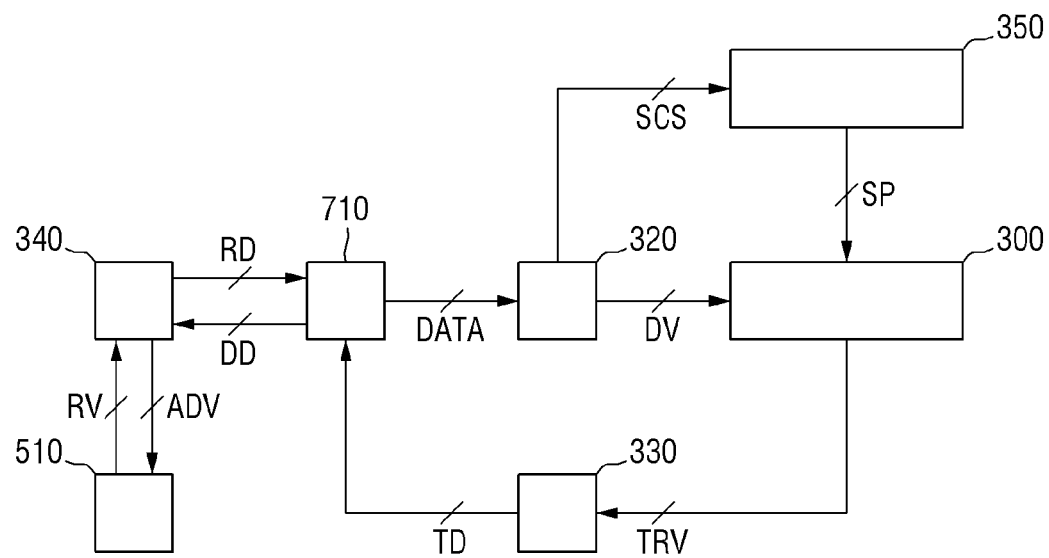
FIG. 9 is a block diagram illustrating the display panel, the actuator and a main processor of the display device according to an exemplary embodiment.

FIG. 9 is a block diagram illustrating electrical connections between various modules including the display module, the actuator 510 and the main processor 710 of the display device 10 according to exemplary embodiments.

Referring to FIG. 9, the display device 10 includes the display panel 300, the display driver 320, the sensor driver 330, the actuator driver 340, a scan driver 350, the actuator 510, and the main processor 710.

The display panel 300 may include the display layer PAL which may include data lines, scan lines intersecting the data lines, and pixels connected data lines and scan lines. Each pixel is connected to any one of the data lines and at least one of the scan lines. In addition, the display layer PAL of the display panel 300 may further include a first power supply voltage line to which a first power supply voltage is supplied and a second power supply voltage line to which a second power supply voltage lower than the first power supply voltage is supplied. In this case, the pixels may be electrically connected to the first power supply voltage line and the second power supply voltage line. Each of the pixels may include a light emitting element, a plurality of transistors configured to supply a light emitting current to the light emitting element, and at least one capacitor.

The display driver 320 receives digital video data DATA and timing signals from the main processor 710. The display driver 320 converts the digital video data DATA into analog data voltages according to the timing signals and applies the analog data voltages to the data lines of the display panel 300. In addition, the display driver 320 may generate a scan control signal SCS configured to control the operation timing of the scan driver 350 according to the timing signals. The display driver 320 may output the scan control signal SCS to the scan driver 350.

The sensor driver 330 receives sensor sensing voltages TRV of the sensor electrodes of the sensor electrode layer SENL of the display panel 300. The sensor driver 330 may convert the sensor sensing voltages TRV into touch row data which is digital data. The sensor driver 330 may analyze the touch row data to calculate touch coordinates at which a user's touch input has occurred. The sensor driver 330 may output touch data TD including the touch coordinates to the main processor 710.

The actuator driver 340 receives a sensing voltage RV generated by the piezoelectric effect of the actuator 510. The actuator driver 340 may convert the analog sensing voltage RV into sensing data RD which is digital data. The actuator driver 340 may output the sensing data RD to the main processor 710.

The actuator driver 340 receives driving data DD from the main processor 710. The actuator driver 340 may generate analog driving voltages ADV according to the driving data DD and output the analog driving voltages ADV to the actuator 510.

The scan driver 350 receives the scan control signal SCS from the display driver 320. The scan driver 350 generates scan signals SP according to the scan control signal SCS and transmits the scan signals SP to the scan lines of the display panel 300.

When pressure is applied to the actuator 510, the actuator 510 may output the sensing voltage RV to the actuator driver 340 due to the piezoelectric effect. The actuator 510 may receive the driving voltages ADV from the actuator driver 340. When the driving voltages ADV are applied to the actuator 510, mechanical deformation may occur due to the inverse piezoelectric effect. For example, the actuator 510 may vibrate according to the period of the driving voltages ADV.

The main processor 710 may convert the resolution of the digital video data DATA received from an external source to match the resolution of the display panel 300. The main processor 710 may output the digital video data DATA and the timing signals to the display driver 320.

The main processor 710 may receive the touch data TD from the sensor driver 330. The main processor 710 may calculate touch coordinates according to the touch data TD. The main processor 710 may perform an operation corresponding to a user's touch. For example, the main processor 710 may execute an application or perform an operation indicated by an icon at touch coordinates determined to have been touched by a user.

The main processor 710 receives the sensing data RD from the actuator driver 340. When the sensing data RD is greater than a threshold value, the main processor 710 may determine that a user has applied pressure. In this case, the main processor 710 may output the driving data DD to the actuator driver 340 in order to provide haptic feedback using the actuator 510.

Figure 10:
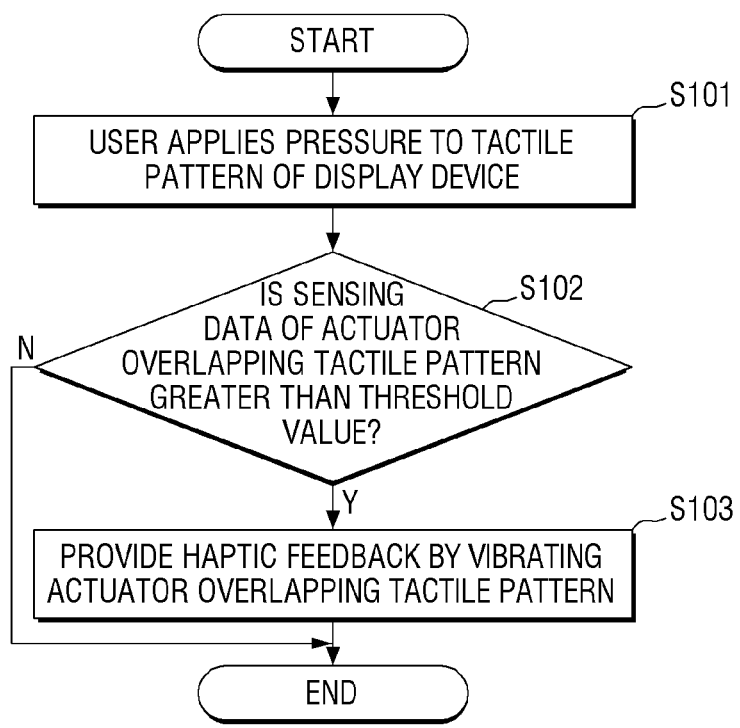
FIG. 10 is a flowchart illustrating a haptic feedback method of the display device according to exemplary embodiments.
Figure 11:
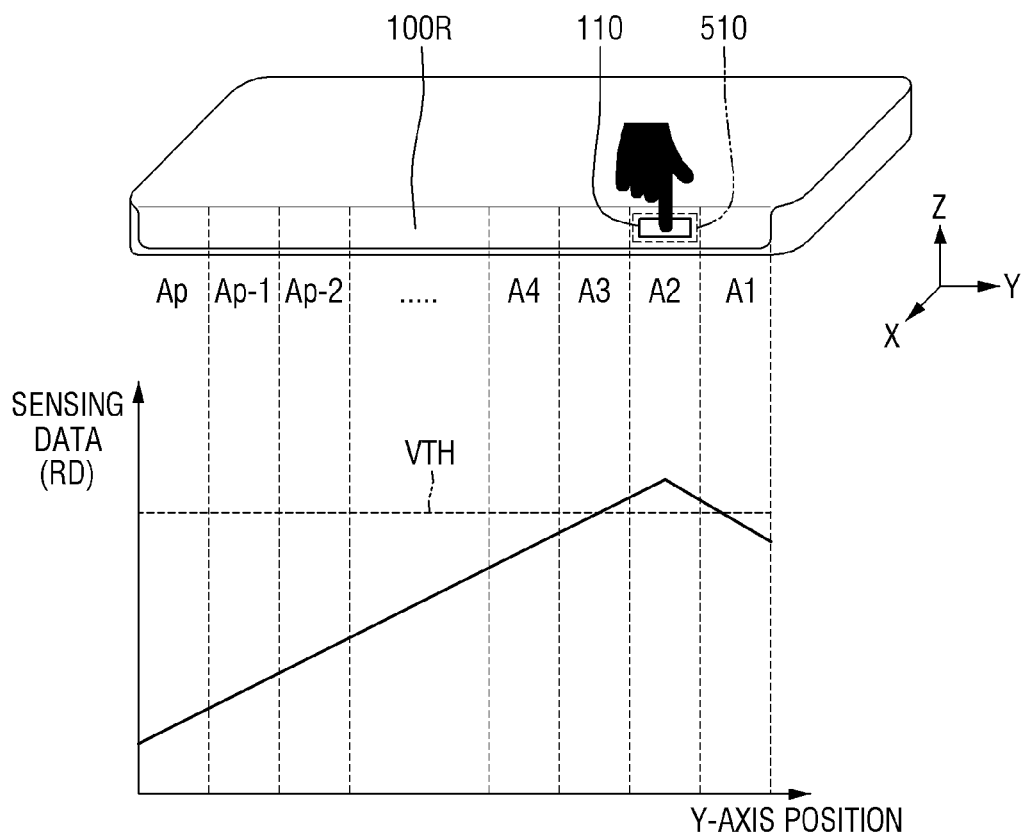
FIG. 11 is a graph illustrating a sensing voltage sensed by the actuator according to pressure applied to a side surface of the display device in exemplary embodiments.
Figure 12:
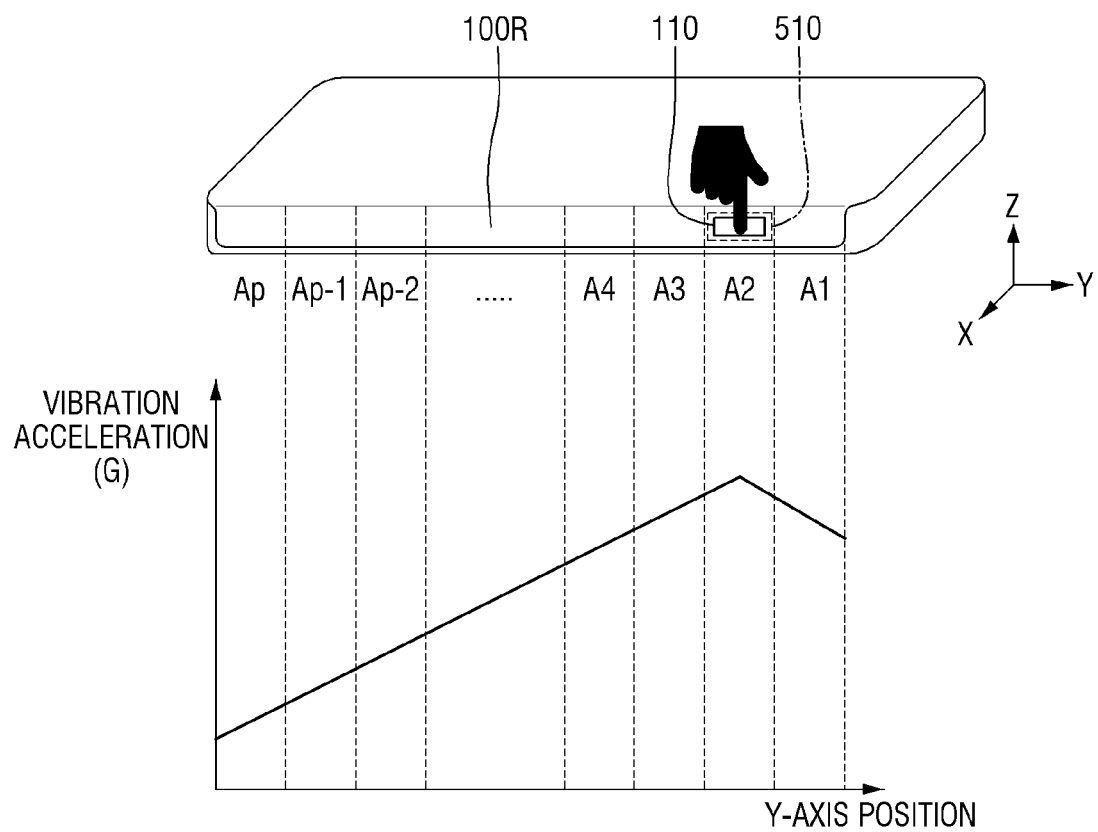
FIG. 12 is a graph illustrating vibration acceleration according to the vibration of the actuator when haptic feedback is provided to a user in exemplary embodiments.

FIG. 10 is a flowchart illustrating a haptic feedback method of the display device 10 according to exemplary embodiments. FIG. 11 is a graph illustrating the sensing voltage RV sensed by the actuator 510 according to pressure applied to a side surface of the display device 10 in exemplary embodiments. FIG. 12 is a graph illustrating vibration acceleration according to the vibration of the actuator 510 when haptic feedback is provided to a user in exemplary embodiments. Vibration acceleration may be characterized as vibration intensity.

First, a user applies pressure to the tactile pattern 110 disposed on a side surface of the display device 10 to execute a predetermined function (operation S101 of FIG. 10).

The tactile pattern 110 may be an embossed pattern protruding from the right side surface portion of the cover window 100 or an intaglio pattern cut into the right side surface portion of the cover window 100. The tactile pattern 110 may be a pattern that may be felt by the user as being different from the cover window 100. Therefore, the user may recognize the tactile pattern 110 as a physical button. Hence, the user may apply pressure to the tactile pattern 110 as if pressing a physical button in order to execute a predetermined function. The predetermined function may be a power control function such as power on or power off or a volume control function configured to increase or decrease the volume. Although the tactile pattern 110 is disposed on an upper surface of the right side surface portion 100R of the cover window 100 illustrated in FIGS. 11 and 12, the position of the tactile pattern 110 is not limited to this position.

In a second operation, it is determined whether the sensing data RD of the actuator 510 overlapping the tactile pattern 110 in the width direction (X-direction) of the display panel 300 is greater than a threshold value VTH (operation S102 of FIG. 10).

As illustrated in FIG. 9, when the user applies pressure to the tactile pattern 110, the actuator 510 overlapping the tactile pattern 110 in the width direction of the display panel 300 may generate the sensing voltage RV due to the piezoelectric effect, and the actuator driver 340 may sense the sensing voltage RV of the actuator 510. The actuator driver 340 may convert the analog sensing voltage RV into the sensing data RD which is digital data and output the sensing data RD to the main processor 710.

The main processor 710 determines whether the sensing data RD is greater than a threshold value VTH. When the sensing data RD is greater than the threshold value VTH, the main processor 710 may determine that the user has applied pressure to the actuator 510. That is, when the sensing data RD is greater than the threshold value VTH, the main processor 710 may determine that the user has applied sufficient pressure to the tactile pattern 110 in order to execute the predetermined function.

Third, when the sensing data RD is greater than the threshold value, the actuator 510 overlapping the tactile pattern 110 in the width direction of the display panel 300 may be vibrated to provide haptic feedback (operation S103 of FIG. 10). Thus when a user applies sufficient pressure to the tactile pattern 110, the tactile pattern 110 may be activated to vibrate.

When the sensing data RD is greater than the threshold value VTH, the main processor 710 may execute the predetermined function assigned to the tactile pattern 110 such as the power control function or the volume control function while outputting the driving data DD stored in the memory to the actuator driver 340. The actuator driver 340 may convert the driving data DD which is digital data into the driving voltages ADV which are analog data and output the driving voltages ADV to the actuator 510. The actuator 510 may vibrate according to the driving voltages ADV due to the inverse piezoelectric effect. That is, the user may be provided with haptic feedback through the vibration of the actuator 510.

As illustrated in FIGS. 11 and 12, the right side surface portion 100R of the cover window 100 may include first through $p^{th}$ areas A1 through Ap (wherein p is an integer of 2 or more), and the tactile pattern 110 and the actuator 510 may be disposed in the second area A2.

As a position (along the Y-axis) to which the user applies pressure moves farther from the tactile pattern 110, sensing data RD (Z-axis) sensed by the actuator 510 may be smaller. For example, as illustrated in FIG. 11, when the position to which the user applies pressure is the second area A2, the sensing data RD sensed by the actuator 510 may be largest. In addition, when the position to which the user applies pressure is the $p^{th}$ area Ap, the sensing data RD sensed by the actuator 510 may be smallest.

In addition, the vibration acceleration of the actuator 510 may become smaller as the distance from the actuator 510 increases. For example, as illustrated in FIG. 12, when the actuator 510 is disposed in the second area A2, the vibration acceleration of the actuator 510 may be largest in the second area A2 and smallest in the $p^{th}$ area Ap. The vibration acceleration of the actuator 510 indicates a value measured by an accelerometer for vibration generated by the actuator 510.

As illustrated in FIGS. 10 through 12, the tactile pattern 110 may be formed on an upper surface of the right side surface portion 100R of the cover window 100. As a result, due to the tactile pattern 110, a user can easily find an area to apply pressure to perform a desired function.

In addition, when the user applies pressure to the tactile pattern 110 of the cover window 100, the sensing data RD of the actuator 510 overlapping the tactile pattern 110 in the width direction of the display panel 300 may be sensed. As illustrated in FIG. 11, when the sensing data RD is greater than the threshold value VTH, a predetermined function such as the power control function or the volume control function may be executed, and at the same time, the actuator 510 may be vibrated by applying driving voltages to the actuator 510 to provide haptic feedback to the user. In an area such as A1, A2, or A3, the vibration acceleration may be felt more by a user. In the area Ap, the vibration acceleration may be smallest. Accordingly, the user can recognize whether a desired function is properly performed by the pressure applied to the tactile pattern 110.

FIGS. 13 through 16 are side views of display devices 10 according to exemplary embodiments.

In each of FIGS. 13 through 16, a right side surface portion 100R of a display device 10 is illustrated. In each of FIGS. 13 through 16, a bottom cover 900 is omitted for ease of description, and only a cover window 100 and a tactile pattern 110 are illustrated.

Although the tactile pattern 110 is disposed on the right side surface portion 100R of the display device 10 in each of FIGS. 13 through 16, the position of the tactile pattern 110 is not limited to this position. For example, the tactile pattern 110 may also be disposed on a left side surface portion 100L of the display device 10 or an upper surface portion 100U of the display device 10.

The tactile pattern 110 may be an embossed pattern protruding from a left or upper surface of the cover window 100 or an intaglio pattern cut into a part of the left or upper surface of the cover window 100.

Figure 13:
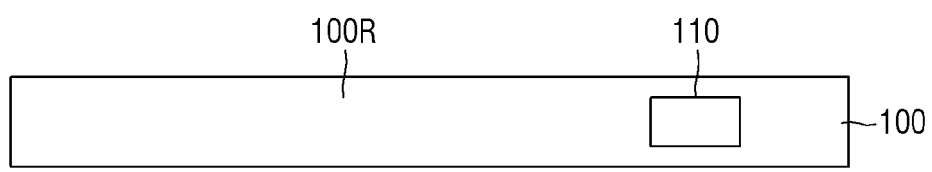
FIG. 13 is a side view illustrating a display device according to an exemplary embodiment.
Figure 13:
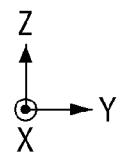
Figure 14:
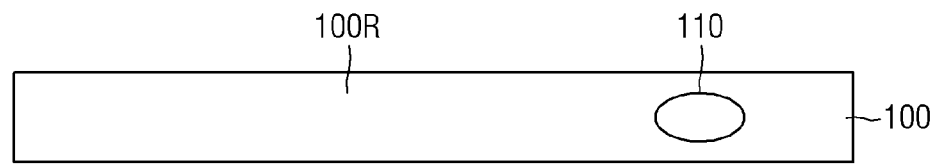
FIG. 14 is a side view illustrating a display device according to an exemplary embodiment.
Figure 14:
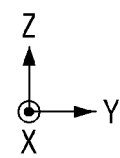

The tactile pattern 110 may be quadrangular in plan view as illustrated in FIG. 13. However, the planar shape of the tactile pattern 110 is not limited to the quadrangular shape and may also be a polygon other than a quadrangle, a circle, or an oval as illustrated in FIG. 14.

Figure 15:
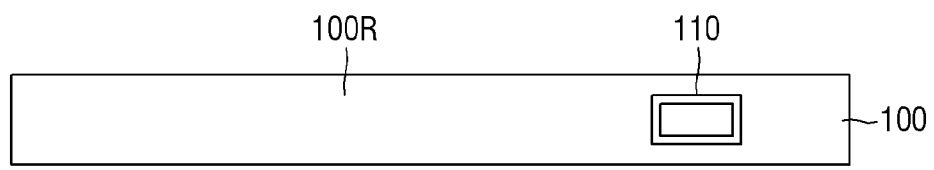
FIG. 15 is a side view illustrating a display device according to exemplary an embodiment.
Figure 15:
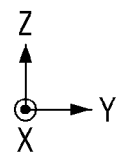

Alternatively, the tactile pattern 110 may be formed in the shape of a quadrangular frame or a quadrangular window frame in plan view as illustrated in FIG. 15. The tactile pattern 110 may be formed as a quadrangular border in plan view. Alternatively, the tactile pattern 110 may be formed in the shape of a polygonal frame other than a quadrangular frame, a circular frame, or an oval frame in plan view.

Figure 16:
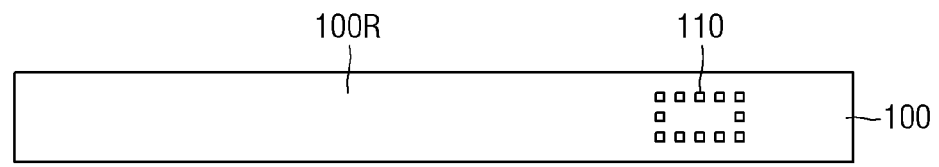
FIG. 16 is a side view illustrating a display device according to an exemplary embodiment.
Figure 16:
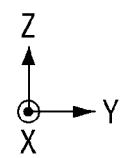

Alternatively, the tactile pattern 110 may include a plurality of dots that form a quadrangle in plan view as illustrated in FIG. 16. Alternatively, the tactile pattern 110 may include a plurality of dots that form a polygon other than a quadrangle, a circle, or an oval in plan view.

The planar shape of the tactile pattern 110 is not limited to the shapes described with reference to FIGS. 13 through 16 and may be various.

FIGS. 17 through 22 are cross-sectional views of the cover window 100 of FIG. 13 and a plurality of tactile patterns 110. In FIGS. 17 through 22, only the cover window 100 and the tactile patterns 110 are illustrated for ease of description.

Figure 17:
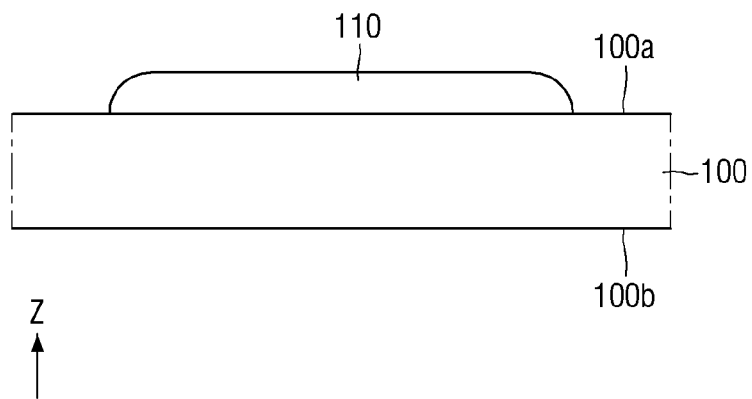
FIG. 17 is a cross-sectional view illustrating a cover window of FIG. 13 and an exemplary tactile pattern.

A tactile pattern 110 may be disposed on a first surface 100a of the cover window 100 as illustrated in FIG. 17. The first surface 100a may refer to the right, left, or upper surface of the cover window 100. The first surface 100a of the cover window 100 may be a surface opposite a second surface 100b of the cover window 100 that faces the display panel 300. The first surface 100a of the cover window 100 may be the upper surface of the cover window 100, and the second surface 100b of the cover window 100 may be a lower surface of the cover window 100. A thickness in the Z-direction of the tactile pattern 110 may be smaller than that of the cover window 100.

The tactile pattern 110 may include an inorganic material or an organic-inorganic hybrid material. For example, the tactile pattern 110 may include a silicon (Si)-based inorganic material. Alternatively, the tactile pattern 110 may include transparent plastic such as polycarbonate (PC) or polymethyl methacrylate (PMMA) and an inorganic material. Alternatively, the tactile pattern 110 have a material in which an organic material such as ultraviolet-curable acrylic or heat-curable epoxy is covalently bonded with a silicon (Si)-based inorganic material. Here, the higher the proportion of the organic material in the tactile pattern 110, the easier the printing of the tactile pattern 110 may be. In addition, the higher the proportion of the inorganic material in the tactile pattern 110, the higher the strength of the tactile pattern 110 may be. Alternatively, the tactile pattern 110 may include frit glass.

Figure 18:
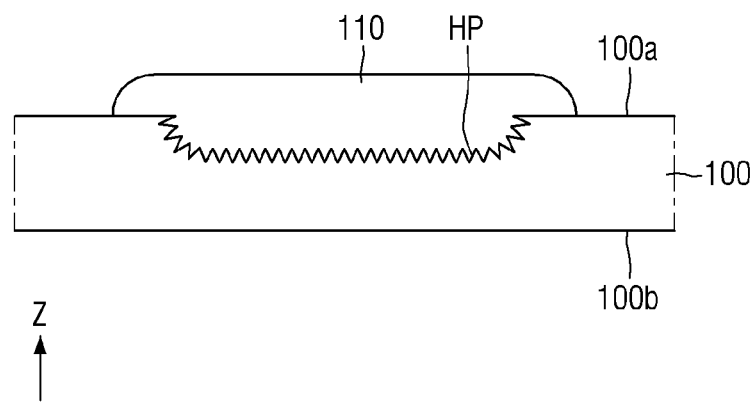
FIG. 18 is a cross-sectional view illustrating the cover window of FIG. 13 and an exemplary tactile pattern.

A tactile pattern 110 may be disposed on a hole pattern HP (or a well pattern) formed in the first surface 100a of the cover window 100 as illustrated in FIG. 18. The hole pattern HP may be formed at the same time as when a through hole is formed in the cover window 100 by computerized numerically control processing. Alternatively, the hole pattern HP may be formed by forming a mask pattern on the first surface of the cover window 100 and etching the cover window 100 using a chemical as in wet etching or dry etching. Alternatively, the hole pattern HP may be formed using a laser. An upper surface of the hole pattern HP may not be even but may be rough as illustrated in FIG. 18.

Figure 19:
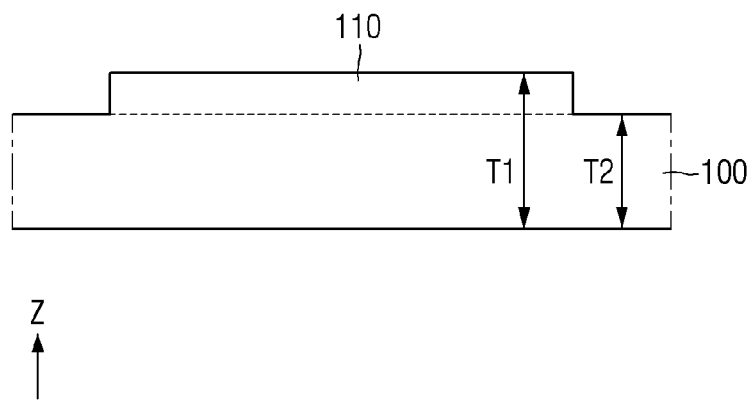
FIG. 19 is a cross-sectional view illustrating the cover window of FIG. 13 and an exemplary tactile pattern.

The tactile pattern 110 may be integrally formed with the cover window 100 as illustrated in FIG. 19. The tactile pattern 110 may be an embossed pattern protruding from the first surface 100a of the cover window 100. In this case, a thickness T1 of the cover window 100 in an area where the tactile pattern 110 is disposed may be greater than a thickness T2 of the cover window 100 in an area where the tactile pattern 110 is not disposed.

Figure 20:
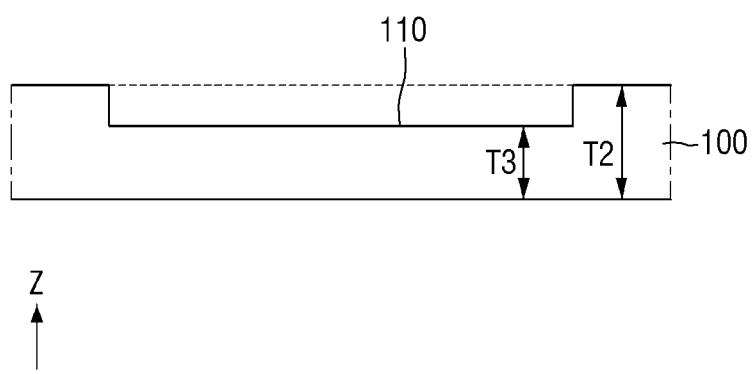
FIG. 20 is a cross-sectional view illustrating the cover window of FIG. 13 and an exemplary tactile pattern.

A tactile pattern 110 may be an intaglio pattern cut into the first surface of the cover window 100 as illustrated in FIG. 20. In this case, a thickness T3 of the cover window 100 in an area where the tactile pattern 110 is disposed may be smaller than the thickness T2 of the cover window 100 in an area where the tactile pattern 110 is not disposed.

Figure 21:
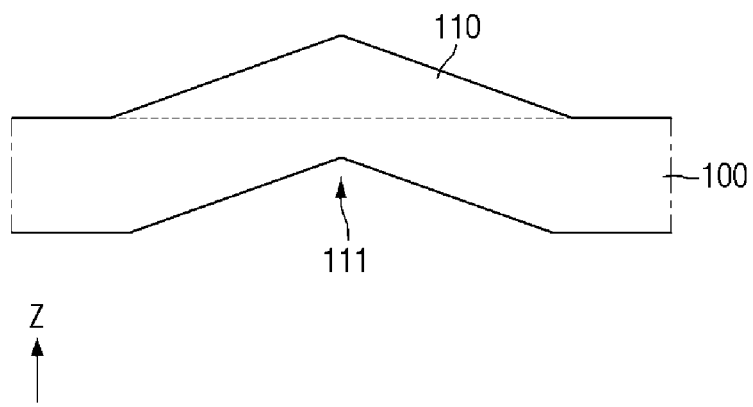
FIG. 21 is a cross-sectional view illustrating the cover window of FIG. 13 and an exemplary tactile pattern.
Figure 22:
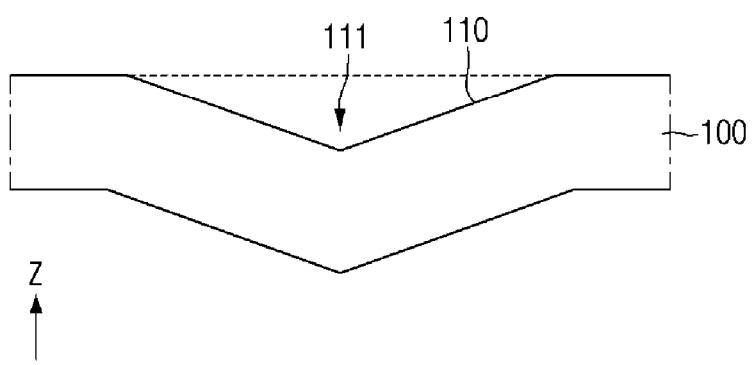
FIG. 22 is a cross-sectional view illustrating the cover window of FIG. 13 and an exemplary tactile pattern.

A tactile pattern 110 may be a part of a bent portion 110 in which the cover window 100 is bent as illustrated in FIGS. 21 and 22. Each of upper and lower surfaces of the bent portion 111 may have a triangular cross-sectional shape as illustrated in FIGS. 21 and 22. When the bent portion 111 protrudes toward the upper surface of the cover window 100 as illustrated in FIG. 21, the tactile pattern 110 may be an embossed pattern. When the bent portion 111 protrudes toward the lower surface of the cover window 100 as illustrated in FIG. 22, the tactile pattern 110 may be an intaglio pattern. The bent portion 111 may be triangular as illustrated or may have rounded edges.

Figure 23:
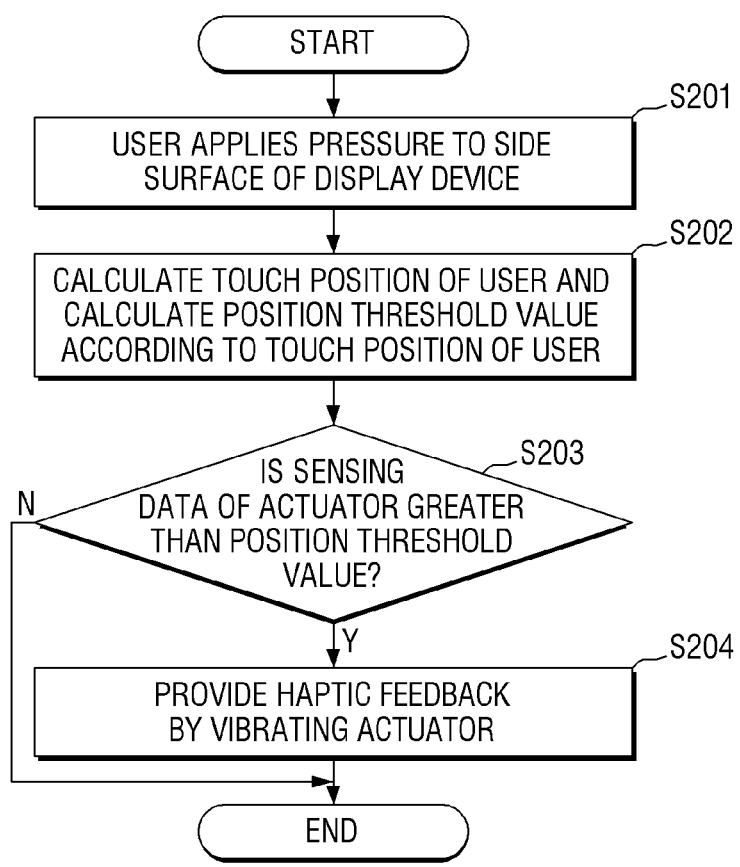
FIG. 23 is a flowchart illustrating a haptic feedback method of a display device according to an exemplary embodiment.
Figure 24:
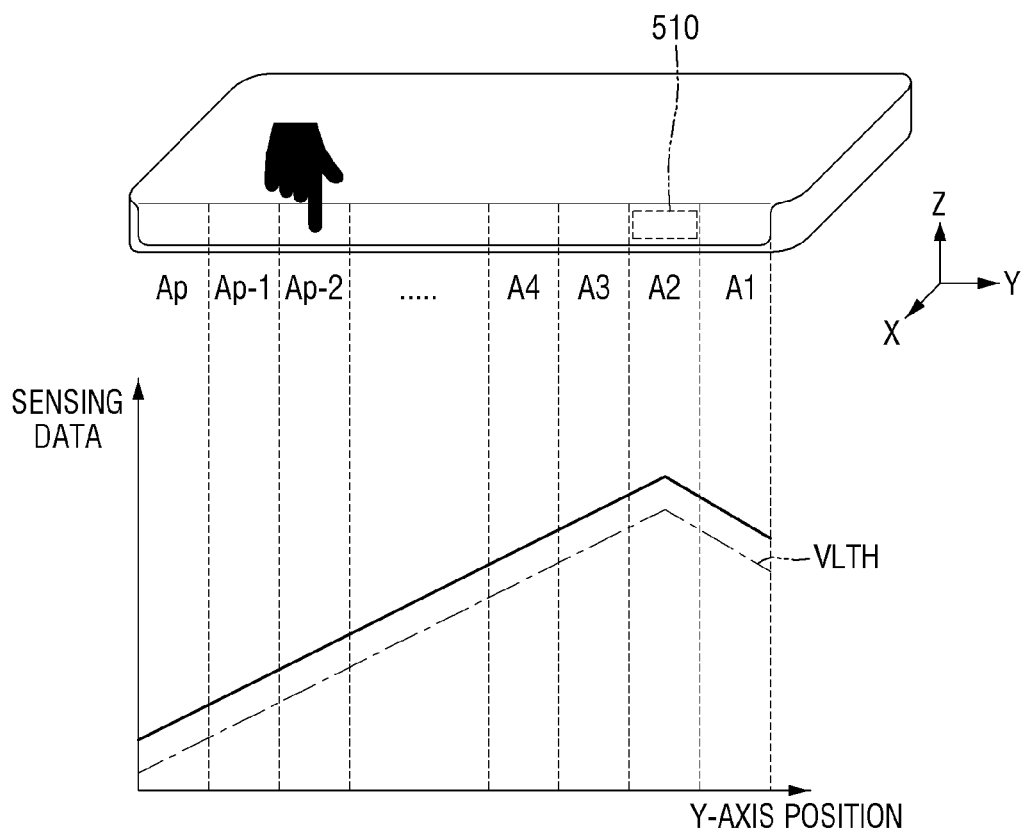
FIG. 24 is a graph illustrating a sensing voltage sensed by an actuator according to pressure applied to a side surface of the display device in accordance with FIG. 23.
Figure 25:
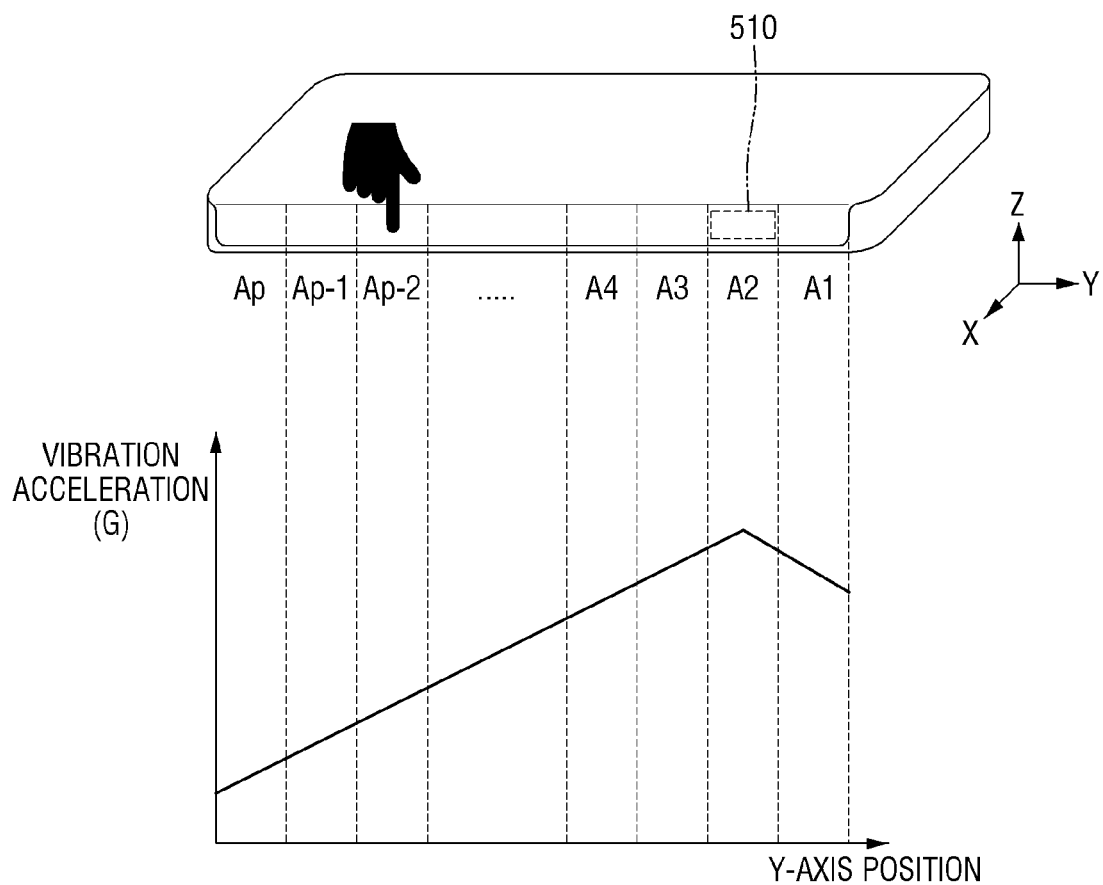
FIG. 25 is a graph illustrating vibration acceleration according to the vibration of the actuator when haptic feedback is provided to a user in accordance with FIG. 23.

FIG. 23 is a flowchart illustrating a haptic feedback method of a display device 10 according to an exemplary embodiment. FIG. 24 is a graph illustrating a sensing voltage RV sensed by an actuator 510 according to pressure applied to a side surface of the display device 10 in accordance with FIG. 23. FIG. 25 is a graph illustrating vibration acceleration according to the vibration of the actuator 510 when haptic feedback is provided to a user in accordance with FIG. 23.

The exemplary embodiment of FIGS. 23 through 25 is different from the embodiment of FIGS. 10 through 12 in that the display device 10 illustrated in FIGS. 23 through 25 does not include a tactile pattern 110. A user may apply pressure to a part of a side surface of the display device 10 instead of applying pressure to a designated area overlapping the actuator 510 in the width direction (X-direction) of a display panel 300.

In the flowchart, first a user applies pressure to a side surface of the display device 10 to execute a predetermined function (operation S201 of FIG. 23).

The tactile pattern 110 may not be formed on the side surface of the display device 10. When the user applies pressure to apart of the side surface of the display device 10, the display device 10 may execute a predetermined function such as a power control function or a volume control function.

Second, a touch position of the user to which the user has applied pressure is calculated, and a position threshold value is calculated according to the touch position of the user (operation S202 of FIG. 23).

When the user touches the display device 10 to apply pressure, the sensor driver 330 may convert sensor sensing voltages of a sensor electrode layer SENL of the display panel 300 into touch row data and calculate touch coordinates of the user by analyzing the touch row data. For example, the sensor driver 330 may calculate coordinates of touch row data which is greater than a touch threshold value as the touch coordinates. The sensor driver 330 may output touch data TD including the touch coordinates of the user to a main processor 710. The touch coordinates may be similar to the areas A1 through Ap.

The main processor 710 may determine the touch position of the user according to the touch coordinates of the touch data TD. The main processor 710 may include a lookup table that stores a position threshold value VLTH for each of the touch coordinates. The lookup table may output the position threshold value VLTH by using the touch coordinates as an input address. The main processor 710 may output the touch coordinates to the lookup table and receive the position threshold value VLTH. The position threshold value VLTH is related to an amount of pressure applied by a user to an area of the window 100.

As a position to which the user applies pressure is farther from the actuator 510, sensing data RD sensed by the actuator 510 may be smaller. Therefore, a threshold value to be compared with the sensing data RD needs to be adjusted according to the position to which the user applies pressure. That is, the position threshold value VLTH may decrease as the distance from the actuator 510 increases. For example, as illustrated in FIG. 24, when the actuator 510 is disposed in a second area A2 of a right side surface portion of the cover window 100, the position threshold value VLTH may be largest in the second area A2 and smallest in a $p^{th}$ area Ap.

Third, it is determined whether the sensing data RD of the actuator 510 is greater than the position threshold value VLTH (operation S203 of FIG. 23).

When the user applies pressure to a part of the side surface of the display device 10, the actuator 510 may generate the sensing voltage RV due to a piezoelectric effect, and an actuator driver 340 may sense the sensing voltage RV of the actuator 510. The actuator driver 340 may convert the analog sensing voltage RV into the sensing data RD which is digital data and output the sensing data RD to the main processor 710.

The main processor 710 determines whether the sensing data RD is greater than the position threshold value VLTH. When the sensing data RD is greater than the position threshold value VLTH, the main processor 710 may determine that the user has applied pressure to the actuator 510. That is, when the sensing data RD is greater than the position threshold value VLTH, the main processor 710 may determine that the user has applied sufficient pressure to a part of the side surface of the display device 10 to execute the predetermined function.

Fourth, when the sensing data RD is greater than the threshold value VLTH, the actuator 510 may be vibrated to provide haptic feedback (operation S204 of FIG. 23).

When the sensing data RD is greater than the position threshold value VLTH, the main processor 710 may execute the predetermined function such as the power control function or the volume control function while outputting driving data DD stored in a memory to the actuator driver 340. The actuator driver 340 may convert the driving data DD which is digital data into driving voltages ADV which are analog data and output the driving voltages ADV to the actuator 510. The actuator 510 may vibrate according to the driving voltages ADV due to an inverse piezoelectric effect. That is, the user may be provided with haptic feedback through the vibration of the actuator 510.

As illustrated in FIG. 24, when the display device 10 does not include the tactile pattern 110, the sensing data RD of the actuator 510 may be smaller as the position to which a user applies pressure is farther from the actuator 510. Therefore, the position threshold value VLTH may be variable and set to a smaller value as the distance from the actuator 510 increases, so that the pressure applied by the user can be sensed using the actuator 510 regardless of the position to which the user applies pressure.

The vibration acceleration of the actuator 510 may decrease as the distance from the actuator 510 increases. For example, as illustrated in FIG. 25, when the actuator 510 is disposed in the second area A2, the vibration acceleration of the actuator 510 may be largest in the second area A2 and smallest in the $p^{th}$ area Ap. Therefore, the haptic feedback felt by the user may decrease as the distance from the actuator 510 increases. Hence, compensation may be sought for a reduction in haptic feedback as the distance from the actuator 510 increases.

FIGS. 26 through 29 illustrate a cover window 100, a display panel 300, an actuator 510, and a plurality of tactile patterns 110 according to exemplary embodiments. The plurality of tactile patterns 110 may be concentrated around the actuator 510 area, or may be spread out along a length of the cover window 100.

In FIGS. 26 through 29, cross sections of only the cover window 100, the display panel 300, the actuator 510, and the plurality of tactile patterns 110 are illustrated.

Figure 26:
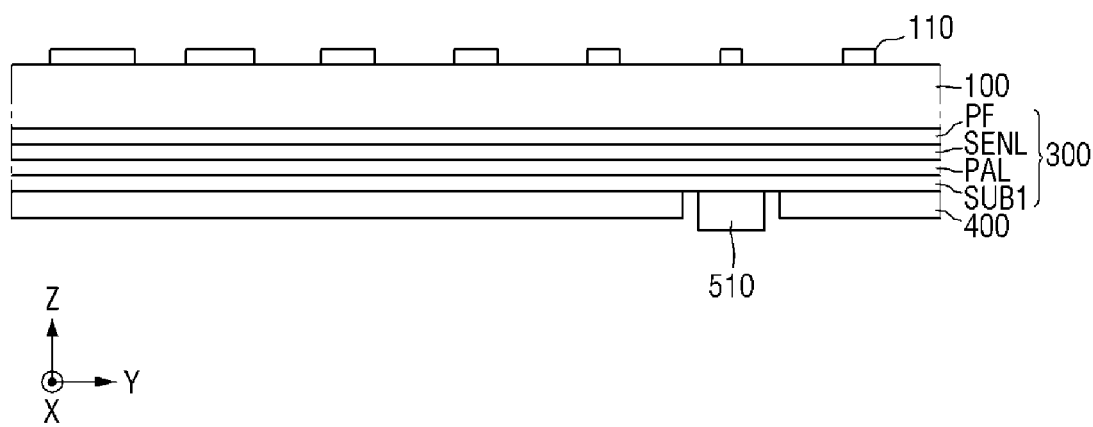
FIG. 26 illustrates an actuator and tactile patterns on a side surface of a display device according to an exemplary embodiment.

Referring to FIG. 26, lengths of the tactile patterns 110 in the second direction (Y-axis direction) may increase as the distance from the actuator 510 in the second direction (Y-axis direction) increases. As the lengths of the tactile patterns 110 in the second direction (Y-axis direction) increase, a contact area between a user's finger and a tactile pattern 110 may increase. An increased contact area between the user's finger and a tactile pattern 110 increases the area of vibration that can be felt by the user, thereby increasing the haptic feedback felt by the user. Therefore, even if the vibration acceleration of the actuator 510 decreases as the distance from the actuator 510 increases, because a contact area between a user's finger and a tactile pattern 110 increases as the distance from the actuator 510 increases, the haptic feedback felt by the user may be almost similar. That is, using tactile patterns 110 of increasingly longer lengths as they move farther from the actuator 510, it is possible to prevent the haptic feedback felt by the user from being reduced as the distance from the actuator 510 increases.

Figure 27:
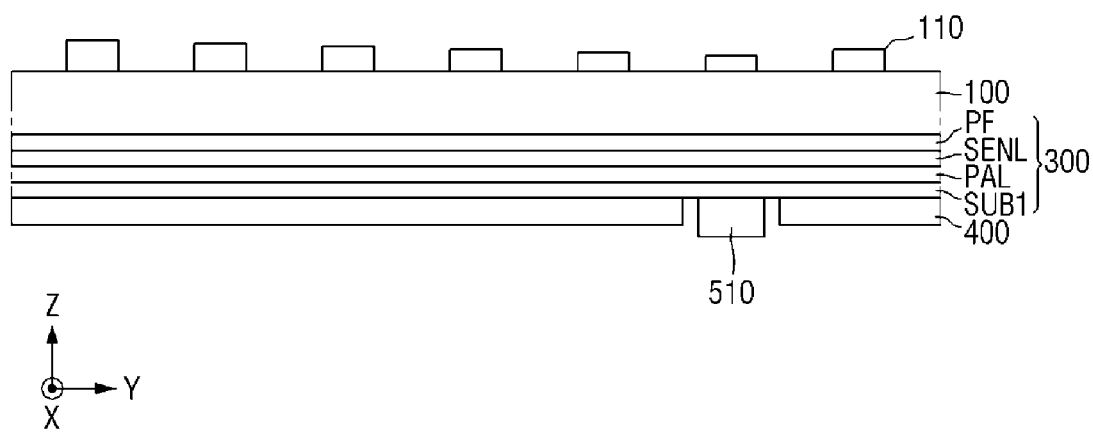
FIG. 27 illustrates an actuator and tactile patterns on a side surface of a display device according to an exemplary embodiment.

Referring to FIG. 27, lengths of the tactile patterns 110 in the third direction (Z-axis direction) may increase as the distance from the actuator 510 in the second direction (Y-axis direction) increases. That is, heights of the tactile patterns 110 protruding from the cover window 100 may increase as the distance from the actuator 510 in the second direction (Y-axis direction) increases. As the lengths of the tactile patterns 110 in the third direction (Z-axis direction) increase, a user's finger may touch not only an upper surface of a tactile pattern 110 but also side surfaces of the tactile pattern 110. That is, the area of vibration that can be felt by the user may increase, thereby increasing the haptic feedback felt by the user. Therefore, even if the vibration acceleration of the actuator 510 decreases as the distance from the actuator 510 increases, because the contact area between the user's finger and a tactile pattern 110 increases as the distance from the actuator 510 increases, the haptic feedback felt by the user may be almost similar. That is, it is possible to prevent the haptic feedback felt by the user from being reduced as the distance from the actuator 510 increases.

Figure 28:
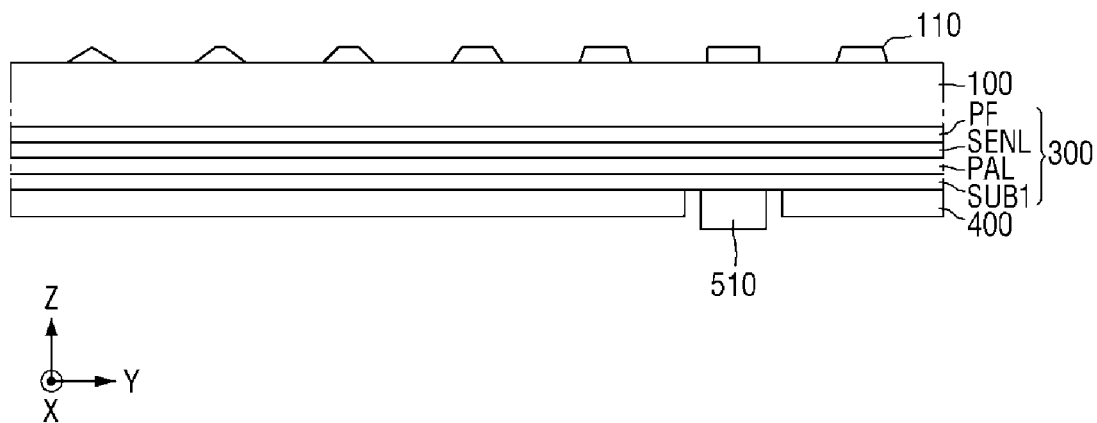
FIG. 28 illustrates an actuator and tactile patterns on a side surface of a display device according to an exemplary embodiment.

Referring to FIG. 28, lengths of the upper surfaces of the tactile pattern 110 may decrease as the distance from the actuator 510 in the second direction (Y-axis direction) increases. Therefore, the tactile patterns 110 may become sharper as the distance from the actuator 510 increases. For example, as the distance from the actuator 510 increases, cross-sectional shapes of the tactile patterns 110 overlapping the actuator 510 in the width direction of the display panel 300 may change to a rectangular shape, a trapezoidal shape, and a triangular shape. As the tactile patterns 110 become sharper, the haptic feedback felt by a user may become greater as the haptic feedback may become concentrated to a smaller area. Therefore, even if the vibration acceleration of the actuator 510 decreases as the distance from the actuator 510 increases, because the tactile patterns 110 are sharper as the distance from the actuator 510 increases, the haptic feedback felt by the user may be almost similar. That is, it is possible to prevent the haptic feedback felt by the user from being reduced as the distance from the actuator 510 increases.

Figure 29:
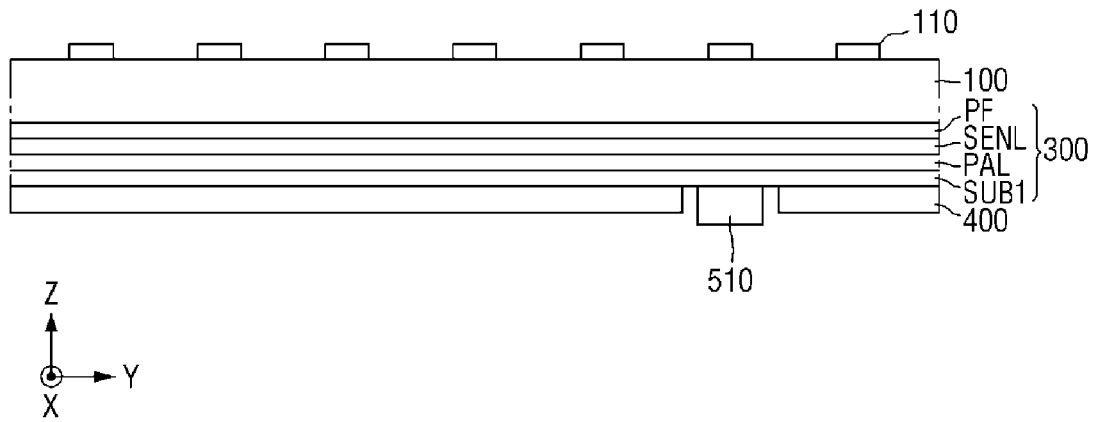
FIG. 29 illustrates an actuator and tactile patterns on a side surface of a display device according to an exemplary embodiment.

Referring to FIG. 29, surface roughness of the tactile patterns 110 or the number of dot patterns of each tactile pattern 110 may increase as the distance from the actuator 510 in the second direction (Y-axis direction) increases. Here, the lengths of the tactile patterns 110 in the second direction (Y-axis direction), the lengths of the tactile patterns 110 in the third direction (Z-axis direction), and the cross-sectional shapes of the tactile patterns 110 may be substantially the same. As the surface roughness of the tactile patterns 110 or the number of dot patterns of each tactile pattern 110 increases, the haptic feedback felt by a user may increase. Therefore, even if the vibration acceleration of the actuator 510 decreases as the distance from the actuator 510 increases, because the surface roughness of the tactile patterns 110 or the number of dot patterns of each tactile pattern 110 increases as the distance from the actuator 510 increases, the haptic feedback felt by the user may be almost similar. That is, the haptic feedback of an increased roughness farther away from the actuator 510 may be similar to the haptic feedback of a decreased roughness closer to the actuator 510. Thus, it is possible to prevent the haptic feedback felt by the user from being reduced as the distance from the actuator 510 increases.

Figure 30:
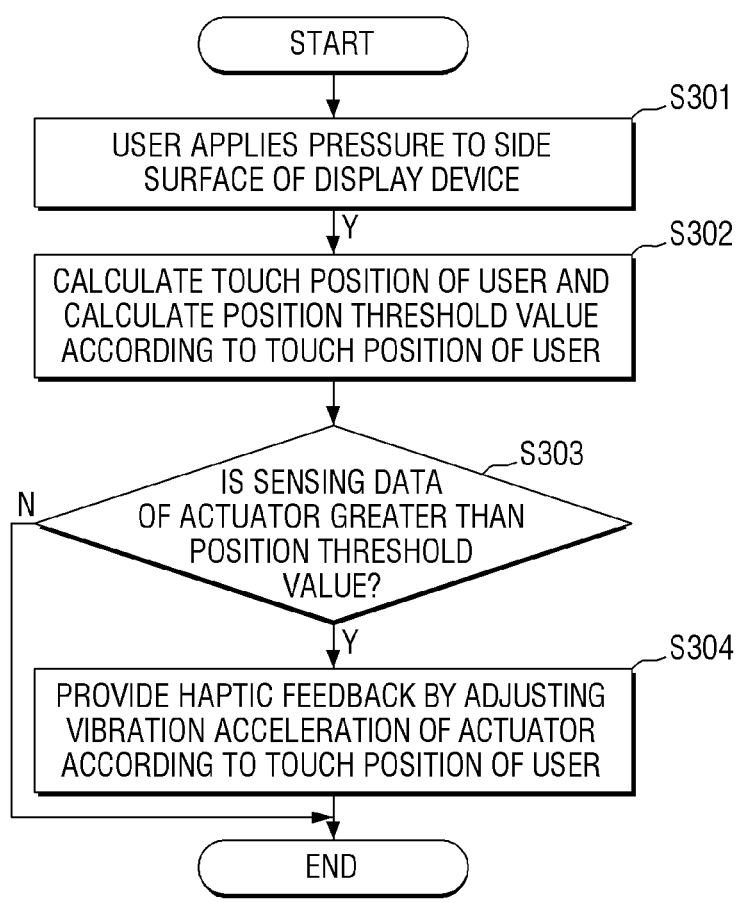
FIG. 30 is a flowchart illustrating a haptic feedback method of a display device according to an exemplary embodiment.
Figure 31:
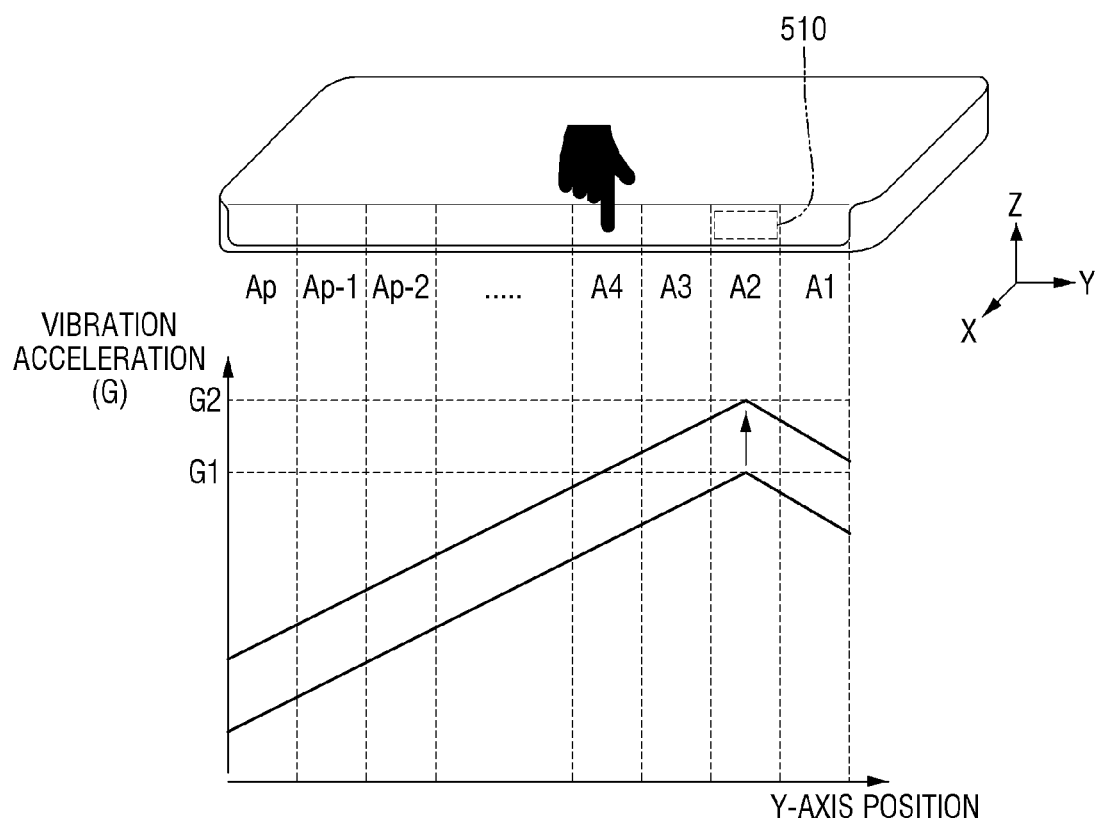
FIG. 31 is a graph illustrating vibration acceleration according to the vibration of an actuator when haptic feedback is provided to a user in accordance with FIG. 30.

FIG. 30 is a flowchart illustrating a haptic feedback method of a display device 10 according to an exemplary embodiment. FIG. 31 is a graph illustrating vibration acceleration according to the vibration of an actuator 510 when haptic feedback is provided to a user in accordance with FIG. 30.

The embodiment of FIGS. 30 and 31 is different from the embodiment of FIGS. 23 through 25 in that the vibration acceleration of the actuator 510 is adjusted according to a touch position of a user in operation S304. Therefore, a description of operations S301 through S303 of FIGS. 30 and 31 will be omitted.

Referring to FIGS. 30 and 31, haptic feedback is provided to a user by adjusting the vibration acceleration of the actuator 510 according to a touch position of the user (operation S304 of FIG. 30).

When sensing data RD is greater than a position threshold value VLTH, a main processor 710 may execute a predetermined function such as a power control function or a volume control function while outputting driving data DD stored in a memory to an actuator driver 340. The main processor 710 may include a lookup table that stores the driving data DD for each touch coordinate. The lookup table may output the driving data DD by using touch coordinates as an input address. The main processor 710 may output the touch coordinates to the lookup table and receive the driving data DD.

The vibration acceleration of the actuator 510 may decrease as the distance from the actuator 510 increases. Therefore, the vibration acceleration of the actuator 510 may be adjusted according to the position to which the user applies pressure. That is, as the touch position of the user is farther from the actuator 510, a swing width of each driving voltage applied to the actuator 510 may be increased to increase the vibration acceleration of the actuator 510.

As illustrated in FIG. 31, when the user applies pressure to a second area A2, the actuator 510 may be vibrated according to the driving voltages having a first swing width, thus causing the second area A2 to provide haptic feedback at first vibration acceleration G1. On the other hand, when the user applies pressure to a fourth area A4, the actuator 510 may be vibrated according to driving voltages having a second swing width greater than the first swing width, thus causing the second area A2 to provide haptic feedback at second vibration acceleration G2 greater than the first vibration acceleration G1. In this case, because the vibration acceleration caused by the actuator 510 decreases the haptic feedback as the distance from the actuator 510 increases, the user's finger located in the fourth area A4 may feel haptic feedback with the first vibration acceleration G1. That is, the user may be provided with haptic feedback of substantially the same vibration acceleration when the user applies pressure to the second area A2 and when the user applies pressure to the fourth area A4.

As illustrated in FIGS. 30 and 31, when the display device 10 does not include a tactile pattern 110, because the vibration acceleration of the actuator 510 decreases as the position to which a user applies pressure is farther from the actuator 510, the swing width of each driving voltage applied to the actuator 510 is increased as the distance from the actuator 510 increases. Therefore, haptic feedback of substantially the same vibration acceleration can be provided regardless of the position to which the user applies pressure.

Figure 32:
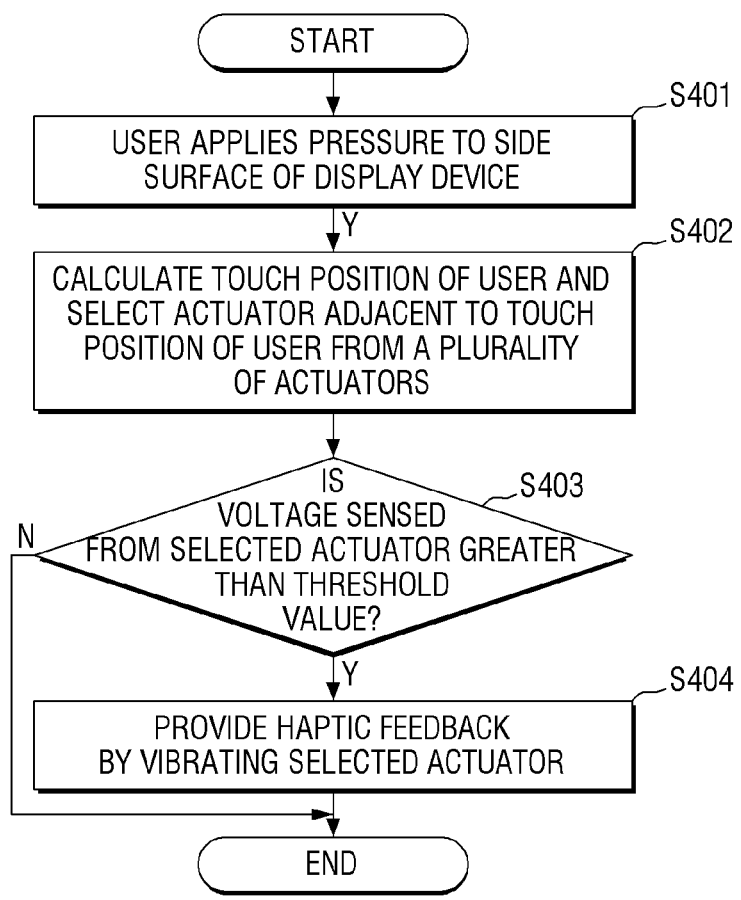
FIG. 32 is a flowchart illustrating a haptic feedback method of a display device according to an exemplary embodiment.
Figure 33:
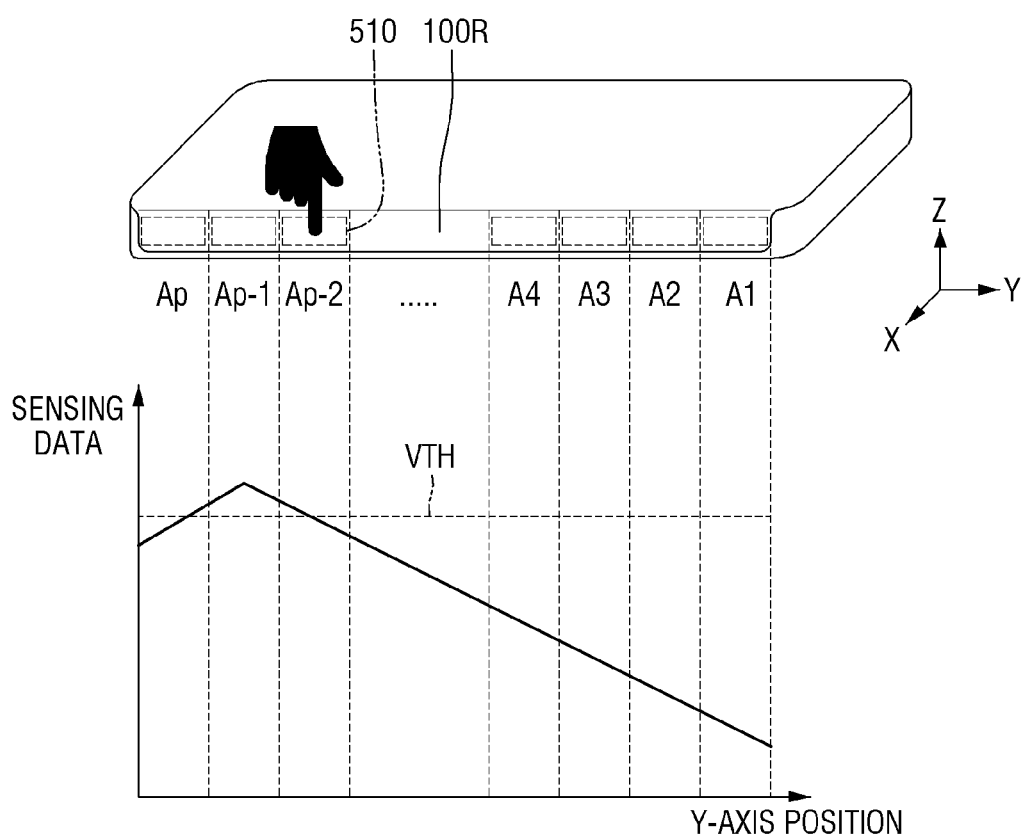
FIG. 33 is a graph illustrating sensing voltages sensed by actuators according to pressure applied to a side surface of the display device in accordance with FIG. 32.
Figure 34:
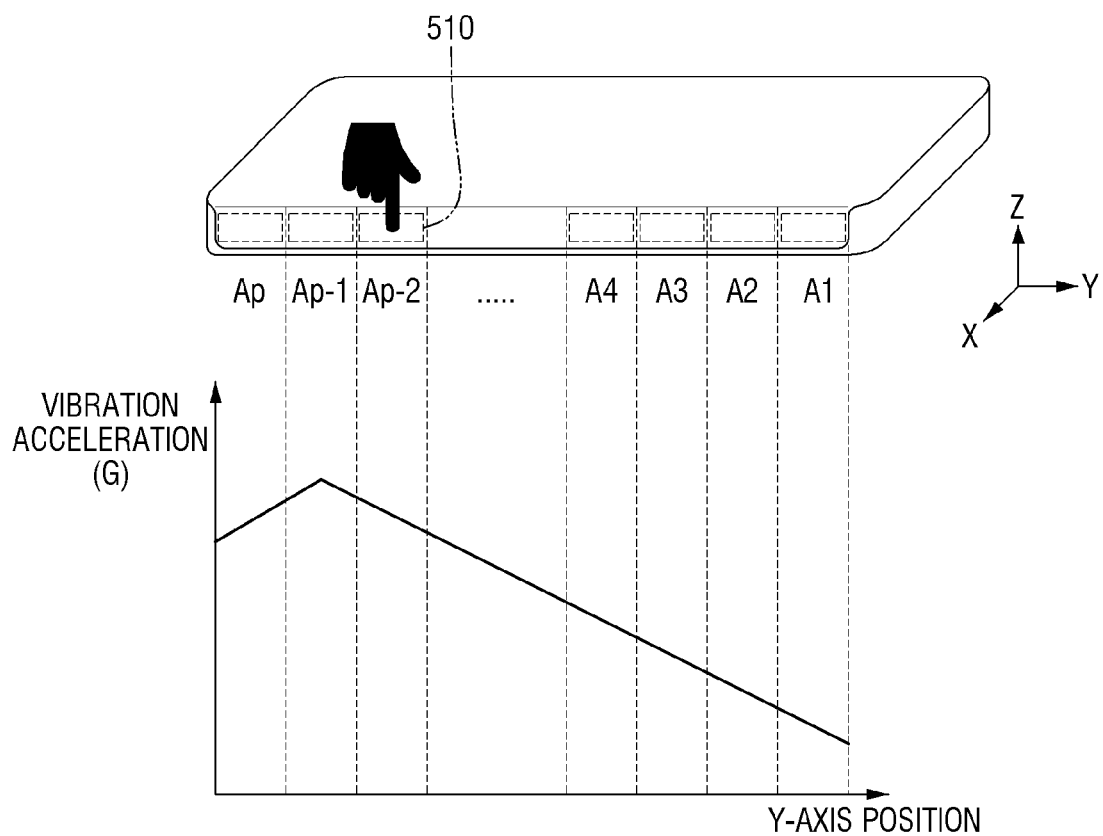
FIG. 34 is a graph illustrating vibration acceleration according to the vibration of the actuators when haptic feedback is provided to a user in t accordance with FIG. 32.

FIG. 32 is a flowchart illustrating a haptic feedback method of a display device 10 according to an embodiment. FIG. 33 is a graph illustrating sensing voltages RV sensed by actuators 510 according to pressure applied to a side surface of the display device 10 in accordance with FIG. 32. FIG. 34 is a graph illustrating vibration acceleration according to the vibration of the actuators 510 when haptic feedback is provided to a user in accordance with FIG. 32.

The embodiment of FIGS. 32 through 34 is different from the embodiment of FIGS. 23 through 25 in that the display device 10 includes a plurality of actuators 510.

First, a user applies pressure to a side surface of the display device 10 to execute a predetermined function (operation S401 of FIG. 32).

Second, a touch position to which the user has applied pressure is calculated, and an actuator 510 adjacent to the touch position of the user is selected from a plurality of actuators 510 (operation S402 of FIG. 32).

When the user touches the display device 10 to apply pressure, a sensor driver 330 may convert sensor sensing voltages of a sensor electrode layer SENL of a display panel 300 into touch row data and calculate touch coordinates of the user by analyzing the touch row data. For example, the sensor driver 330 may calculate coordinates of touch row data which is greater than a touch threshold value as the touch coordinates. The sensor driver 330 may output touch data TD including the touch coordinates of the user to a main processor 710.

The actuators 510 may respectively be disposed in first through $p^{th}$ areas A1 through Ap of a right side surface portion 100R of a cover window 100. For example, one of the actuators 510 may be disposed in each of the first through $p^{th}$ areas A1 through Ap of the right side surface portion of the cover window 100. Alternatively, the actuators 510 may be disposed in some of the first through $p^{th}$ areas A1 through Ap of the right side surface portion of the cover window 100. For example, the actuators 510 may be disposed in the first through $p^{th}$ areas A1 through Ap of the right side surface portion of the cover window 100, respectively.

When the user applies pressure to the side surface of the display device 10, each of the actuators 510 generates the sensing voltage RV of varying levels due to a piezoelectric effect. An actuator driver 340 may sense various sensing voltages RV of each of the actuators 510. The actuator driver 340 may convert the analog sensing voltages RV into sensing data RD which is digital data and output the sensing data RD to the processor 710.

The main processor 710 may determine the touch position of the user according to the touch coordinates of the touch data TD. The main processor 710 may select an actuator 510 adjacent to the touch position of the user from the actuators 510. For example, as illustrated in FIG. 33, when the user applies pressure to the $(p-2)^{th}$ area Ap-2 of the right side surface portion of the cover window 100, the main processor 710 may determine the $(p-2)^{th}$ area Ap-2 as the touch position of the user and select an actuator 510 disposed in the $(p-2)^{th}$ area Ap-2 from among the actuators 510, but embodiments are not limited thereto. When pressure is applied to one or more actuators, the main processor may 710 may determine one or more actuators that is pressed.

Third, it is determined whether the sensing data RD of a selected actuator 510 is greater than a threshold value VTH (operation S403 of FIG. 32).

The main processor 710 determines whether the sensing data RD of the one or more selected actuators 510 is greater than the threshold value VTH. When the sensing data RD of the one or more selected actuators 510 is greater than the threshold value VTH, the main processor 710 may determine that the user has applied pressure to the side surface of the display device 10 to execute the predetermined function.

Fourth, when the sensing data RD of the one or more selected actuators 510 is greater than the threshold value VTH, the selected one or more actuators 510 may be vibrated to provide haptic feedback (operation S404 of FIG. 32).

When the sensing data RD is greater than the threshold value VTH, the main processor 710 may execute the predetermined function such as a power control function or a volume control function while outputting driving data DD configured to drive the one or more selected actuators 510 to the actuator driver 340. The actuator driver 340 may convert the driving data DD which is digital data into driving voltages ADV which are analog data and output the driving voltages ADV to the one or more selected actuators 510. The one or more selected actuators 510 may vibrate according to the driving voltages ADV due to an inverse piezoelectric effect. That is, the user may be provided with haptic feedback through the vibration of the one or more selected actuators 510. As illustrated in FIG. 34, the actuator 510 disposed in the $(p-2)^{th}$ area Ap-2 where the user's finger is located may be vibrated to provide haptic feedback to the user.

As illustrated in FIGS. 32 through 34, when a user applies pressure to an area of a side surface of the display device 10 to execute a predetermined function, an actuator 510 adjacent to the position to which the user applies pressure is selected from the actuators 510, and the pressure applied by the user is sensed using the selected actuator 510. Therefore, there is no need to apply a different threshold value according to the position to which the user applies pressure. In addition, because haptic feedback is provided to the user by vibrating the selected actuator 510, there is no need to adjust the driving voltages of the actuator 510 according to the position to which the user applies pressure.

Figure 35:
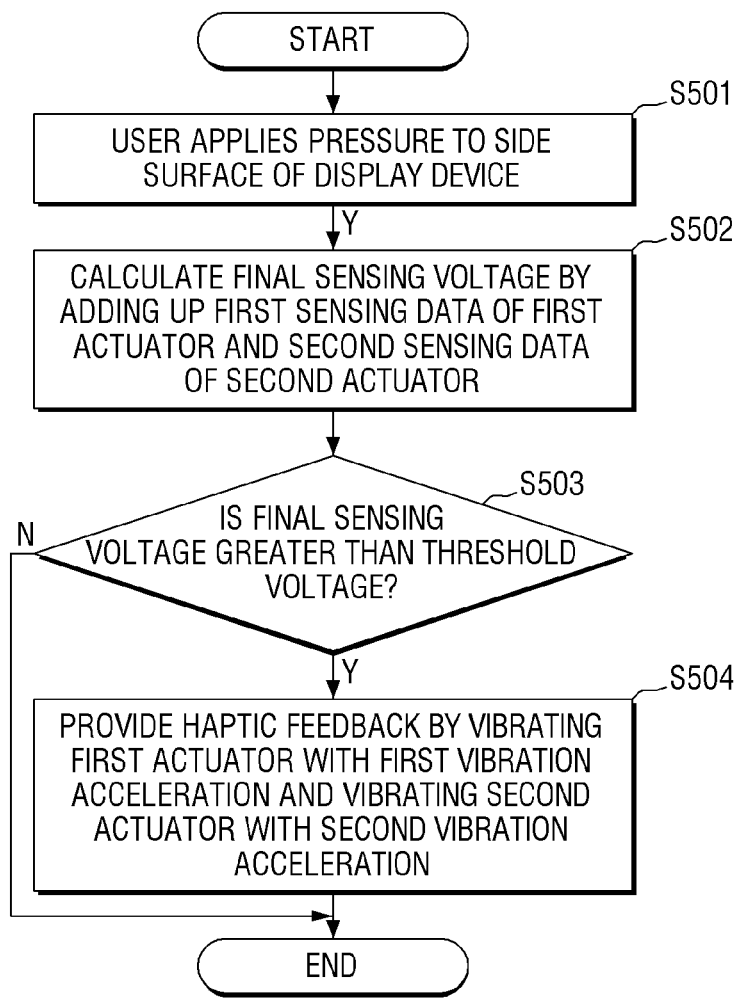
FIG. 35 is a flowchart illustrating a haptic feedback method of a display device according to an exemplary embodiment.
Figure 36:
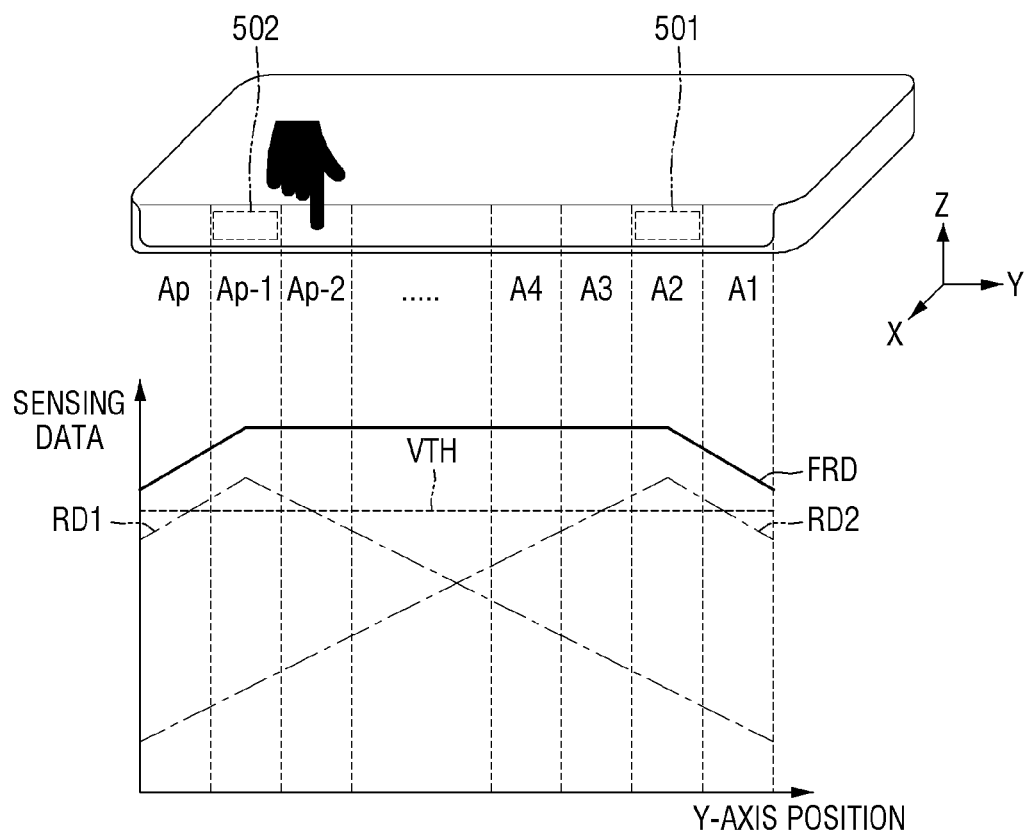
FIG. 36 is a graph illustrating sensing voltages sensed by actuators according to pressure applied to a side surface of the display device in accordance with FIG. 35.
Figure 37:
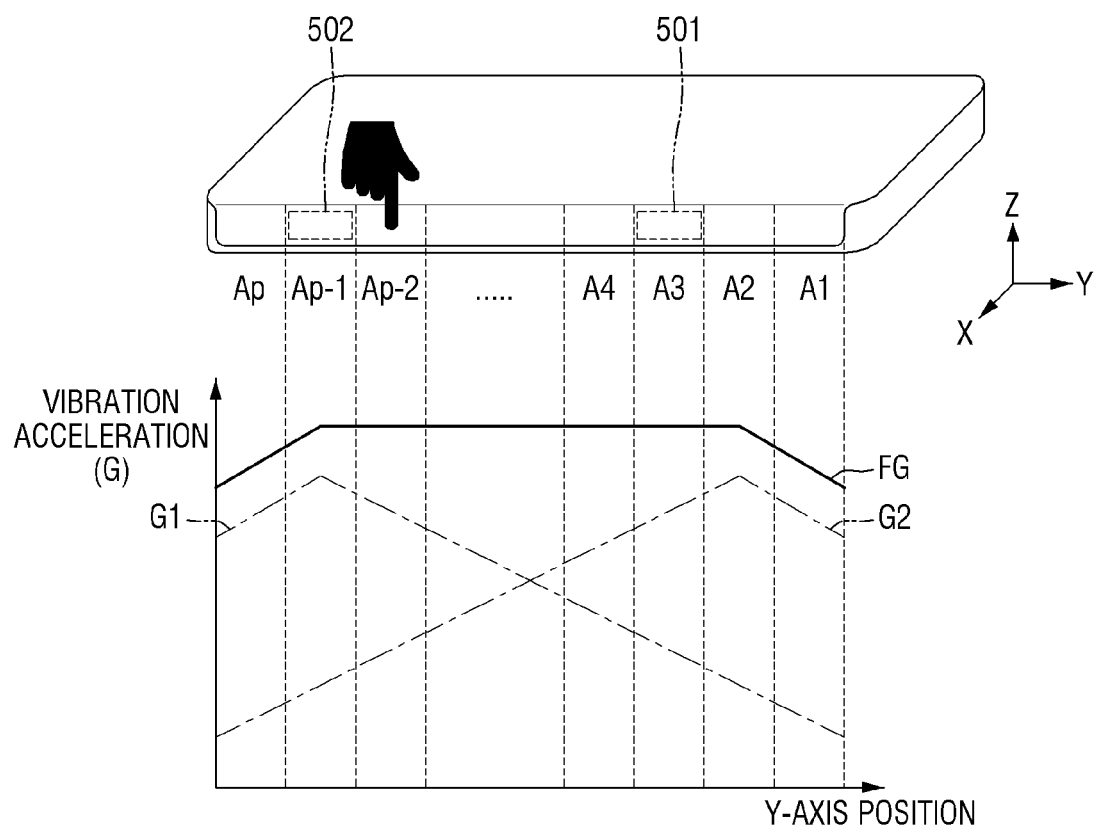
FIG. 37 is a graph illustrating vibration acceleration according to the vibration of the actuators when haptic feedback is provided to a user in accordance with FIG. 35.

FIG. 35 is a flowchart illustrating a haptic feedback method of a display device 10 according to an exemplary embodiment. FIG. 36 is a graph illustrating sensing voltages RV sensed by actuators 511 and 520 according to pressure applied to a side surface of the display device 10 in accordance with FIG. 35. FIG. 37 is a graph illustrating vibration acceleration according to the vibration of the actuators 511 and 520 when haptic feedback is provided to a user in accordance with FIG. 35.

The embodiment of FIGS. 35 through 37 is different from the embodiment of FIGS. 23 through 25 in that the display device 10 includes a first actuator 511 and a second actuator 512.

In the flowchart, first a user applies pressure to a side surface of the display device 10 to execute a predetermined function (operation S501 of FIG. 35).

Second, the first and second actuators 511 and 520 may be disposed on a right side surface portion of a cover window 100. The first and second actuators 511 and 520 may be disposed in two of first through $p^{th}$ areas A1 through Ap of the right side surface portion of the cover window 100, respectively. The position of the first actuator 511 and the position of the second actuator 512 may be symmetrical with respect to a center of the right side surface portion of the cover window 100. That is, the first actuator 511 may be disposed adjacent to an upper side of the right side surface portion of the cover window 100, and the second actuator 512 may be disposed adjacent to a lower side of the right side surface portion of the cover window 100. For example, as illustrated in FIGS. 36 and 37, the first actuator 511 may be disposed in the second area A2, and the second actuator 512 may be disposed in the $(p-1)^{th}$ area Ap-1. The positions of the first and second actuators 511 and 520 are not limited to those illustrated in FIGS. 36 and 37.

When the user applies pressure to the side surface of the display device 10, each of the first and second actuators 511 and 520 generates the sensing voltage RV due to a piezoelectric effect. As illustrated, this may apply when a user does not touch an area that directly overlaps one of the first and second actuators 511 and 520. An actuator driver 340 may sense a first sensing voltage of the first actuator 511 and a second sensing voltage of the second actuator 512. The actuator driver 340 may convert the first sensing voltage into first sensing data RD1 which is digital data and the second sensing voltage into second sensing data RD2 which is digital data and output the first sensing data RD1 and the second sensing data RD2 to a main processor 710. The main processor 710 may calculate final sensing data FRD by adding up the first sensing data RD1 of the first actuator 511 and the second sensing data RD2 of the second actuator 512.

Third, it is determined whether the final sensing data FRD is greater than a threshold value VTH (operation S503 of FIG. 35).

The main processor 710 determines whether the final sensing data FRD is greater than the threshold value VTH. When the final sensing data FRD is greater than the threshold value VTH, the main processor 710 may determine that the user has applied pressure to the side surface of the display device 10 to execute the predetermined function.

As illustrated in FIG. 36, when the user applies pressure to the $(p-2)^{th}$ area Ap-2 of the cover window 100, because the first actuator 511 is disposed in the second area A2 and the second actuator 512 is disposed in the $(p-1)^{th}$ area Ap-1, both the first sensing data RD1 of the first actuator 511 and the second sensing data RD2 of the second actuator 512 may be smaller than the threshold value VTH. However, the final sensing data FRD obtained by adding up the first sensing data RD1 of the first actuator 511 and the second sensing data RD2 of the second actuator 512 may be greater than the threshold value VTH. That is, when the first and second actuators 511 and 520 are disposed on the right side surface portion 100R of the cover window 100, the final sensing data FRD obtained by adding up the first sensing data RD1 of the first actuator 511 and the second sensing data RD2 of the second actuator 512 may be compared with the threshold value VTH. Therefore, there is no need to apply a different threshold value according to the position to which the user applies pressure.

Fourth, when the final sensing data FRD is greater than the threshold value VTH, the first and second actuators 511 and 520 may be vibrated to provide haptic feedback (operation S504 of FIG. 35).

When the final sensing data FRD is greater than the threshold value VTH, the main processor 710 may execute the predetermined function such as a power control function or a volume control function while outputting first driving data configured to drive the first actuator 511 and second driving data configured to drive the second actuator 512 to the actuator driver 340. The actuator driver 340 may convert the first driving data which is digital data into first sub-driving voltages which are analog data and output the first sub-driving voltages to the first actuator 511. The actuator driver 340 may convert the second driving data which is digital data into second sub-driving voltages which are analog data and output the second sub-driving voltages to the second actuator 512. The first actuator 511 may vibrate according to the first sub-driving voltages due to an inverse piezoelectric effect, and the second actuator 512 may vibrate according to the second sub-driving voltages due to the inverse piezoelectric effect. The user may be provided with haptic feedback through the vibration of the first actuator 511 and the vibration of the second actuator 512. For example, as illustrated in FIG. 37, the user may be provided with haptic feedback in the $(p-2)^{th}$ area Ap-2 according to final vibration acceleration FG obtained by adding up first vibration acceleration G1 of the first actuator 511 and second vibration acceleration G2 of the second actuator 512. Vibration acceleration may be analogous to vibration intensity. Just as pressure must reach a certain threshold to be registered to provide haptic feedback, vibration intensity may have a maximum level as output from an actuator.

As illustrated in FIGS. 35 through 37, when a user applies pressure to an area of a side surface of the display device 10 to execute a predetermined function, the final sensing data FRD obtained by adding up the first sensing data RD1 of the first actuator 511 and the second sensing data RD2 of the second actuator 512 is compared with a threshold value to determine whether the user has applied pressure. Therefore, there is no need to apply a different threshold value according to the position to which the user applies pressure. In addition, because haptic feedback is provided to the user according to the final vibration acceleration FG obtained by adding up the first vibration acceleration G1 of the first actuator 511 and the second vibration G2 of the second actuator 512, there is no need to adjust driving voltages of the first and second actuators 511 and 512 according to the position to which the user applies pressure.

Figure 38:
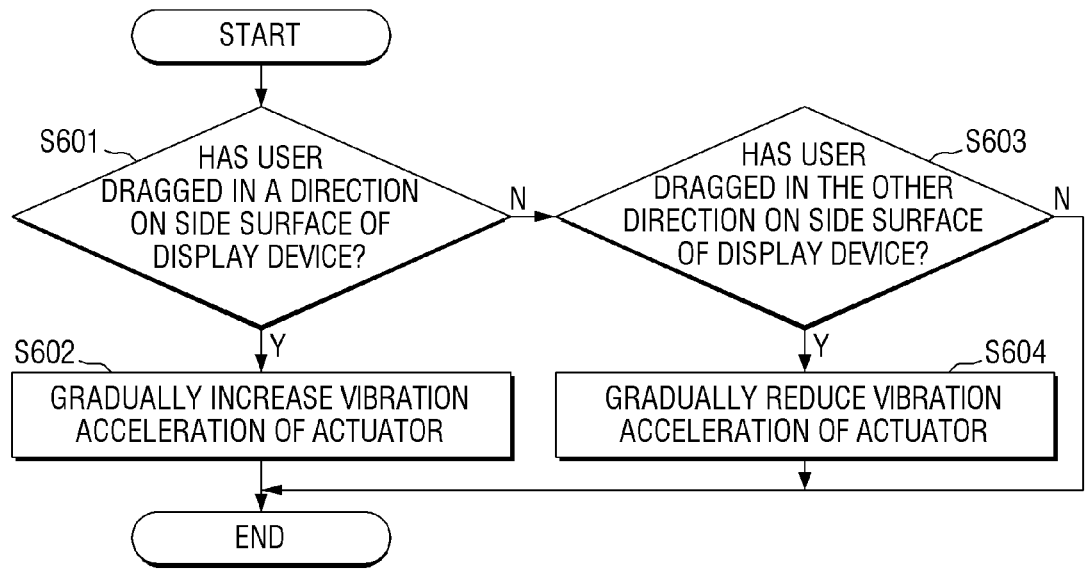
FIG. 38 is a flowchart illustrating a haptic feedback method of a display device according to an exemplary embodiment.
Figure 39:
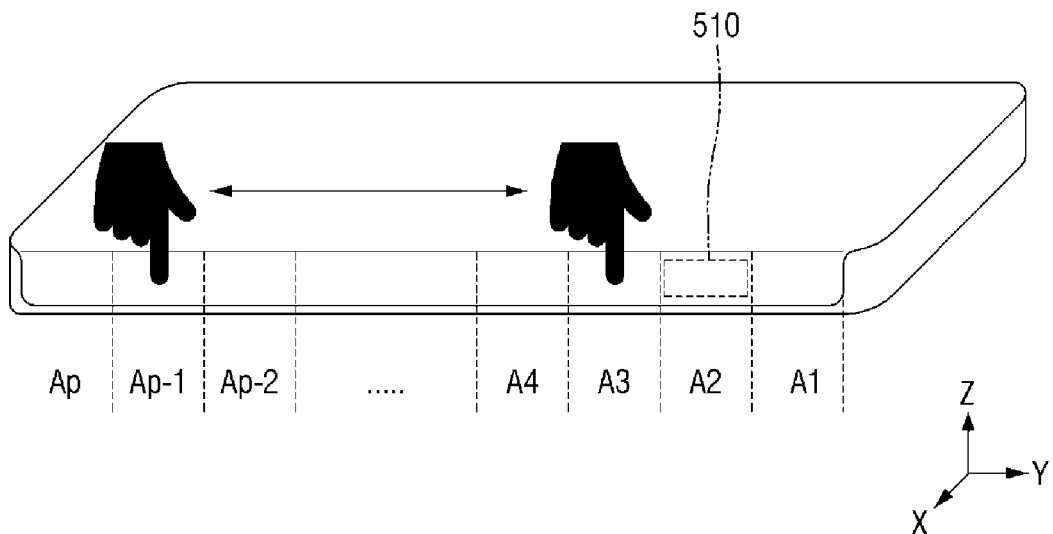
FIG. 39 illustrates dragging on a side surface of the display device with a finger in an exemplary embodiment.

FIG. 38 is a flowchart illustrating a haptic feedback method of a display device 10 according to an exemplary embodiment. FIG. 39 illustrates dragging on a side surface of the display device 10 with a finger in an exemplary embodiment.

First, it is determined whether a user has dragged a finger or the like in a direction on aside surface of the display device 10 to execute a first function. For example, it may be determined whether the user has dragged a finger or the like in the direction on the side surface of the display device 10 to perform a function of increasing the volume (operation S601 of FIG. 38).

When the user touches the display device 10, a sensor driver 330 may convert sensor sensing voltages of a sensor electrode layer SENL of a display panel 300 into touch row data and calculate touch coordinates of the user by analyzing the touch row data. For example, the sensor driver 330 may calculate coordinates of touch row data which is greater than a touch threshold value as the touch coordinates. The sensor driver 330 may output touch data TD including the touch coordinates of the user to a main processor 710. The main processor 710 may determine whether the user has dragged a finger or the like in the direction on the side surface of the display device 10 by analyzing the touch data TD received during a plurality of frame periods. The direction may be a direction parallel to the second direction (Y-axis direction) and may be a direction from a lower side toward an upper side of a right side surface of the display device 10.

Second, when it is determined that the user has dragged in the direction on the side surface of the display device 10, vibration acceleration of an actuator 510 disposed on the side surface of the display device 10 is gradually increased (operation S602 of FIG. 38).

The main processor 710 may output driving data DD to an actuator driver 340 during a plurality of frame periods. The actuator driver 340 may convert the driving data DD which is digital data into driving voltages ADV which are analog data and output the driving voltages ADV to the actuator 510. The actuator 510 may vibrate according to the driving voltages ADV due to an inverse piezoelectric effect.

Here, a swing width of each driving voltage ADV applied to the actuator 510 during the frame periods may gradually increase. Therefore, the user may be provided with haptic feedback with gradually increasing intensity of vibration.

Third, when it is determined that the user has not dragged in the direction on the side surface of the display device 10 to perform a second function, it is determined whether the user has dragged in the other direction on the side surface of the display device 10. For example, it may be determined whether the user has dragged in the other direction on the side surface of the display device 10 to perform a function of reducing the volume (operation S603 of FIG. 38).

The main processor 710 may determine whether the user has dragged in the other direction on the side surface of the display device 10 by analyzing the touch data TD received during a plurality of frame periods. The other direction may be a direction parallel to the second direction (Y-axis direction) and may be a direction from the upper side toward the lower side of the right side surface of the display device 10.

Fourth, when it is determined that the user has dragged in the other direction on the side surface of the display device 10, the vibration acceleration of the actuator 510 disposed on the side surface of the display device 10 is gradually reduced (operation S604 of FIG. 38).

The swing width of each driving voltage ADV applied to the actuator 510 during the frame periods may gradually decrease. Therefore, the user may be provided with haptic feedback with gradually decreasing intensity of vibration.

As illustrated in FIGS. 38 and 39, when a user drags in a direction on a side surface of the display device 10 or when the user drags in the other direction on the side surface of the display device 10, the vibration acceleration of the actuator 510 disposed on the side surface of the display device 10 may be increased or reduced, thereby providing different feedback to the user.

Figure 40:
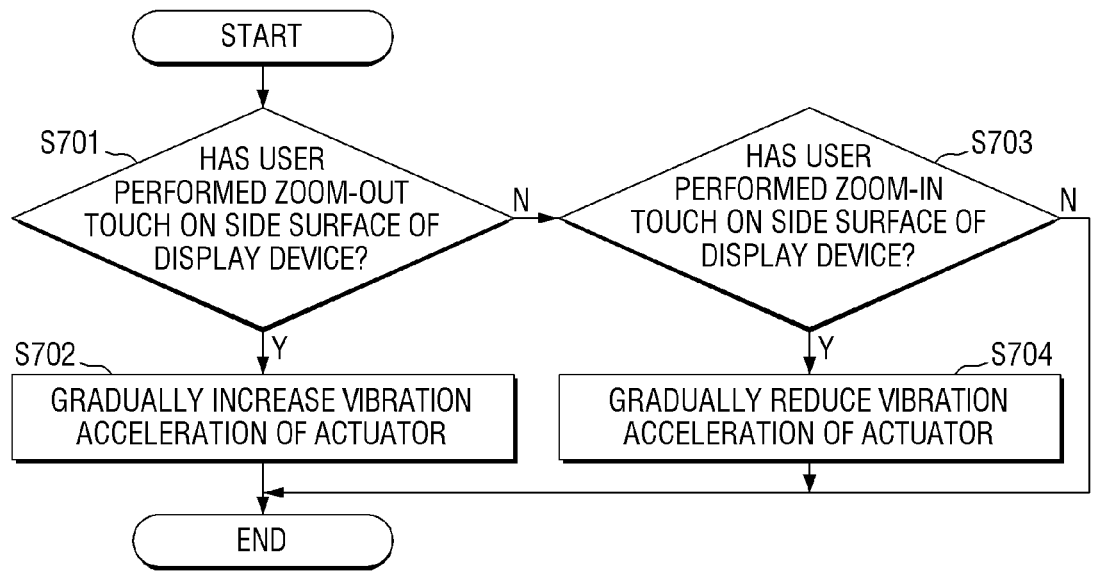
FIG. 40 is a flowchart illustrating a haptic feedback method of a display device according to an exemplary embodiment.
Figure 41:
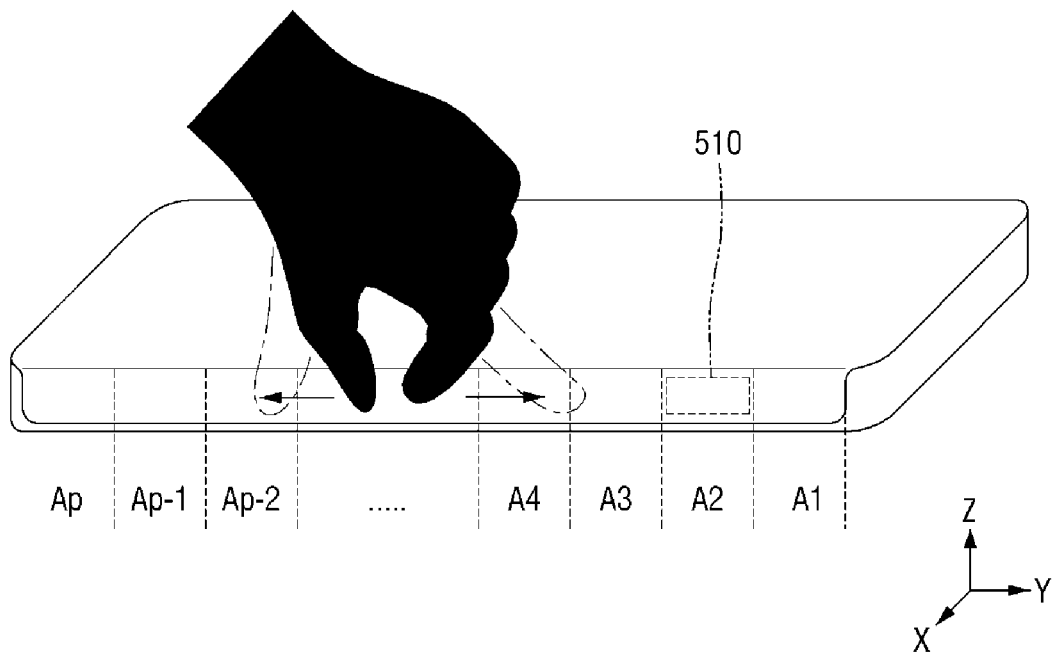
FIG. 41 illustrates zooming in or zooming out on a side surface of a display panel with a finger in an exemplary embodiment.

FIG. 40 is a flowchart illustrating a haptic feedback method of a display device 10 according to an exemplary embodiment. FIG. 41 illustrates zooming in or zooming out on a side surface of a display panel 300 with a finger in an exemplary embodiment.

First, it is determined whether a user has performed a zoom-in touch on a surface of the display device 10 to perform a first function. For example, it may be determined whether the user has performed the zoom-in touch on the surface of the display device 10 to perform a zoom-in function (operation S701 of FIG. 40).

When the user touches the display device 10, a sensor driver 330 may convert sensor sensing voltages of a sensor electrode layer SENL of the display panel 300 into touch row data and calculate touch coordinates of the user by analyzing the touch row data. For example, the sensor driver 330 may calculate coordinates of touch row data which is greater than a touch threshold value as the touch coordinates. The sensor driver 330 may output touch data TD including the touch coordinates of the user to a main processor 710. The main processor 710 may determine whether the user has performed the zoom-in touch on the surface of the display device 10 by analyzing the touch data TD received during a plurality of frame periods.

Second, when it is determined that the user has performed the zoom-in touch on the surface of the display device 10, vibration acceleration of an actuator 510 disposed on the surface of the display device 10 is gradually increased (operation S702 of FIG. 40).

The main processor 710 may output driving data DD to an actuator driver 340 during a plurality of frame periods. The actuator driver 340 may convert the driving data DD which is digital data into driving voltages ADV which are analog data and output the driving voltages ADV to the actuator 510. The actuator 510 may vibrate according to the driving voltages ADV due to an inverse piezoelectric effect.

Here, a swing width of each driving voltage ADV applied to the actuator 510 during the frame periods may gradually increase. Therefore, the user may be provided with haptic feedback with gradually increasing intensity of vibration.

Third, when it is determined that the user has not performed the zoom-in touch on the surface of the display device 10 to perform a second function, it is determined whether a zoom-out touch has been performed on the surface of the display device 10. For example, it may be determined whether the user has performed the zoom-out touch on the surface of the display device 10 to perform a zoom-out function (operation S703 of FIG. 40).

The main processor 710 may determine whether the user has performed the zoom-out touch on the surface of the display device 10 by analyzing the touch data TD received during a plurality of frame periods.

Fourth, when it is determined that the user has performed the zoom-out touch on the surface of the display device 10, the vibration acceleration of the actuator 510 disposed on the surface of the display device 10 is gradually reduced (operation S704 of FIG. 40).

The swing width of each driving voltage ADV applied to the actuator 510 during the frame periods may gradually decrease. Therefore, the user may be provided with haptic feedback with gradually decreasing intensity of vibration.

As illustrated in FIGS. 40 and 41, when a user performs a zoom-in touch or a zoom-out touch on a surface of the display device 10, the vibration acceleration of the actuator 510 disposed on a side surface of the display device 10 may be increased or reduced, thereby providing different feedback to the user.

Figure 42:
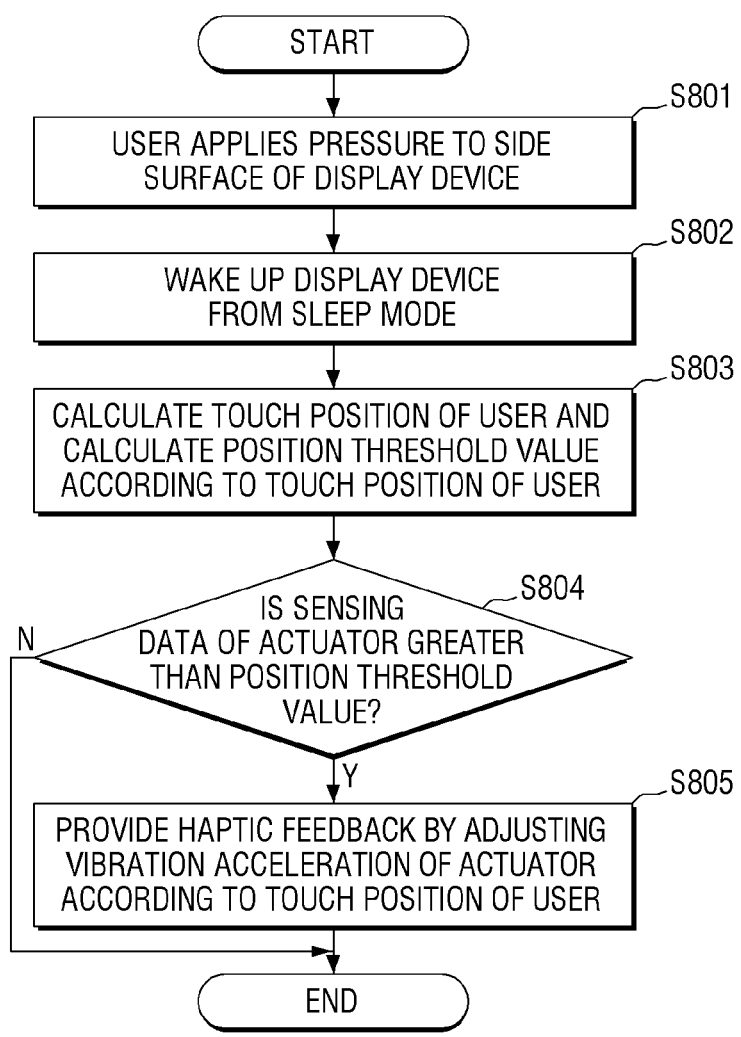
FIG. 42 is a flowchart illustrating a haptic feedback method of a display device according to an exemplary embodiment.

FIG. 42 is a flowchart illustrating a haptic feedback method of a display device 10 according to an exemplary embodiment.

The embodiment of FIG. 42 is different from the embodiment of FIGS. 30 and 31 in that the display device 10 is controlled to wake up from a sleep mode when a user touches a side surface of the display device 10 to apply pressure to the side surface of the display device 10. Therefore, a description of operations S801 and S803 through S805 illustrated in FIG. 42 will be omitted.

Referring to FIG. 42, when a user touches a side surface of the display device 10 to apply pressure to the side surface of the display device 10, the display device 10 wakes up from the sleep mode. In the sleep mode, power is not supplied to a display layer PAL of a display panel 300 to reduce power consumption of the display device 10. Therefore, an image may not be displayed on the display panel 300 (operation S802 of FIG. 42).

When the user touches the display device 10 to apply pressure, a sensor driver 330 may convert sensor sensing voltages of a sensor electrode layer SENL of the display panel 300 into touch row data and calculate touch coordinates of the user by analyzing the touch row data. For example, the sensor driver 330 may calculate coordinates of touch row data which is greater than a touch threshold value as the touch coordinates. The sensor driver 330 may output touch data TD including the touch coordinates of the user to a main processor 710.

When the main processor 710 determines that the user's touch has occurred by analyzing the touch data TD, it may wake up the display device 10 from the sleep mode. For example, the main processor 710 may control the display device 10 to display an initial screen such as a lock screen when the display device 10 wakes up from the sleep mode.

As illustrated in FIG. 42, because the display device 10 may be driven in the sleep mode before a user touches a side surface of the display device 10, the power consumption of the display device 10 can be reduced.

Figure 43:
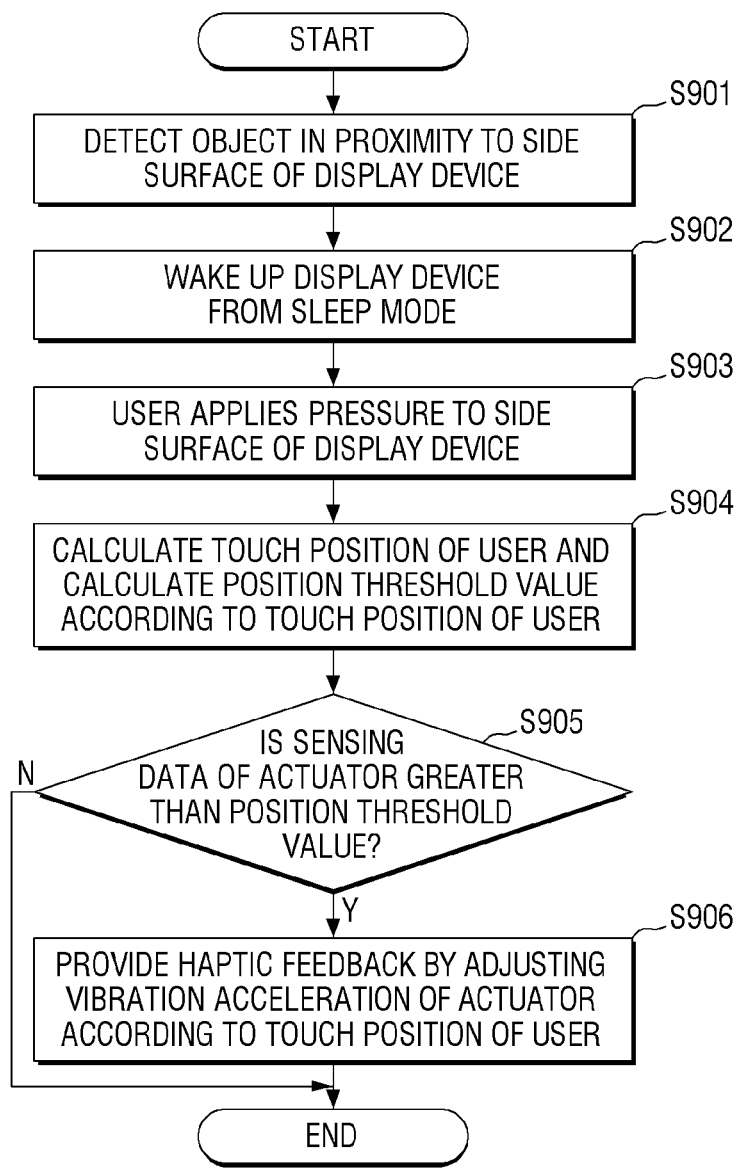
FIG. 43 is a flowchart illustrating a haptic feedback method of a display device according to an exemplary embodiment.

FIG. 43 is a flowchart illustrating a haptic feedback method of a display device 10 according to an exemplary embodiment.

The embodiment of FIG. 43 is different from the embodiment of FIGS. 30 and 31 in that the display device 10 is controlled to wake up from a sleep mode when a user approaches the display device 10 to apply pressure to a side surface of the display device 10. Therefore, a description of operations S903 through S906 illustrated in FIG. 43 will be omitted.

First, it is determined whether there is an object in proximity to a side surface of the display device 10 (operation S901 of FIG. 43).

When a user approaches a side surface of the display device 10 to apply pressure, a sensor driver 330 may convert sensor sensing voltages of a sensor electrode layer SENL of a display panel 300 into touch row data and calculate proximity coordinates of the user by analyzing the touch row data. For example, the sensor driver 330 may calculate coordinates of touch row data which is greater than a proximity threshold value as the proximity coordinates. The proximity threshold value may be smaller than a touch threshold value. The sensor driver 330 may output touch data TD including the proximity coordinates of the user to a main processor 710. The main processor 710 may determine whether the user is in proximity to the side surface of the display device 10 by analyzing the touch data TD.

Second, when an object in proximity to the side surface of the display device 10 is detected, the display device 10 may be woken up from the sleep mode (operation S902 of FIG. 43).

When the main processor 710 determines that the user is in proximity to the side surface of the display device 10, it may wake up the display device 10 from the sleep mode. For example, the main processor 710 may control the display panel 300 to display an initial screen such as a lock screen when the display device 10 wakes up from the sleep mode.

As illustrated in FIG. 42, because the display device 10 may be driven in the sleep mode before a user approaches the display device 10 to apply pressure to a side surface of the display device 10, the power consumption of the display device 10 can be reduced.

Figure 44:
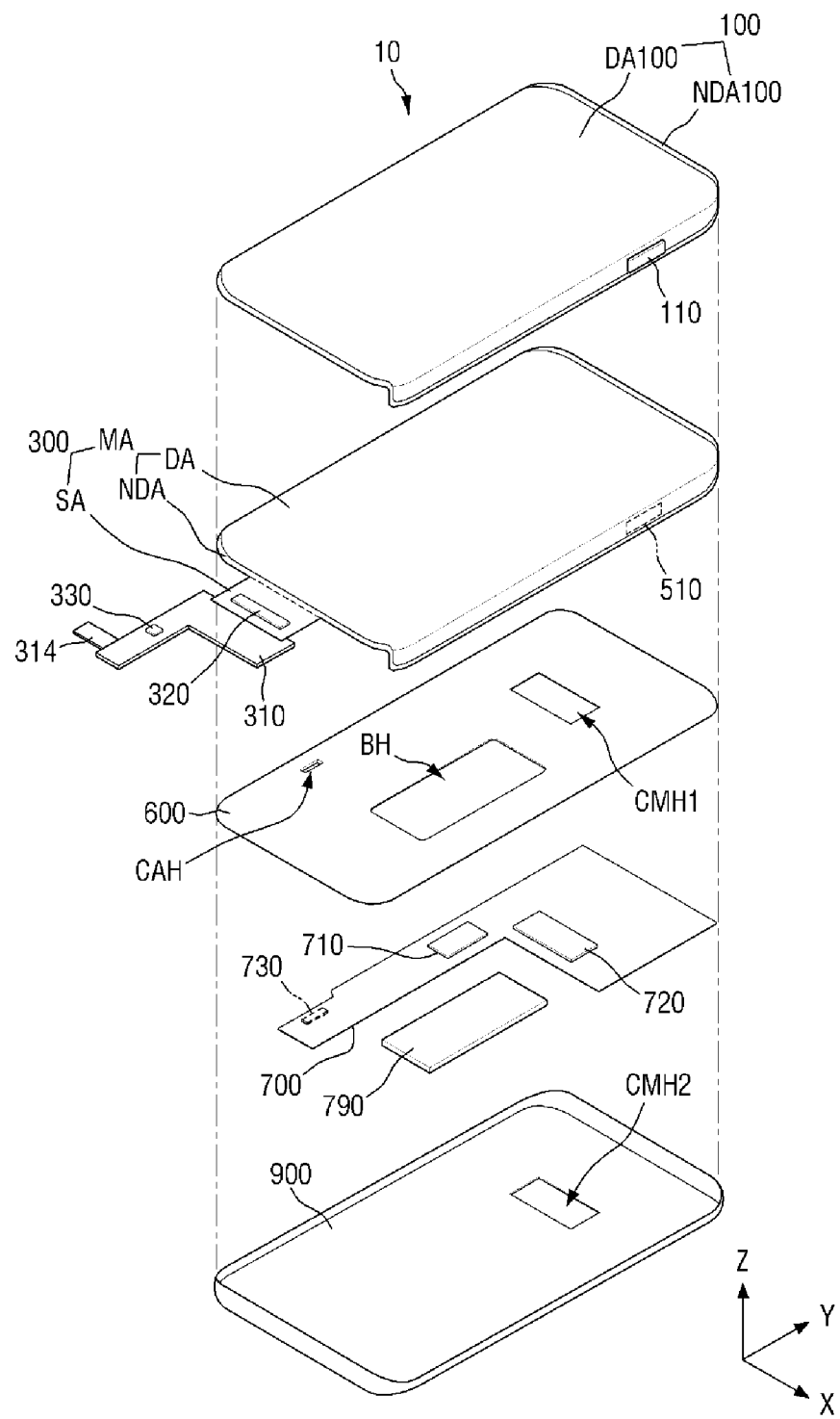
FIG. 44 is an exploded perspective view illustrating a display device according to an exemplary embodiment.
Figure 45:
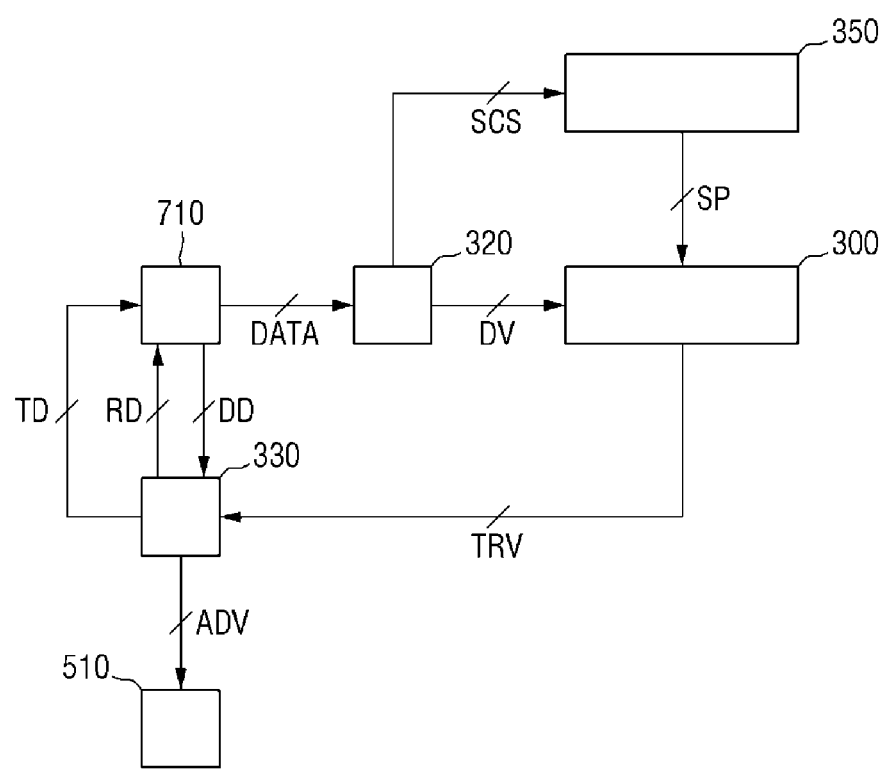
FIG. 45 is a block diagram illustrating a display panel, an actuator, and a main processor of the display device in accordance with FIG. 44.

FIG. 44 is an exploded perspective view of a display device 10 according to an embodiment. FIG. 45 is a block diagram illustrating a display panel 300, an actuator 510, and a main processor 710 of the display device 10 according to the embodiment.

The embodiment of FIGS. 44 and 45 is different from the embodiment of FIGS. 2 and 9 in that an actuator driver 340 is integrated into a sensor driver 330. When the actuator driver 340 is integrated into the sensor driver 330 as illustrated in FIGS. 44 and 45, the number of integrated circuits attached to a display circuit board 310 can be reduced, thereby reducing costs.

Figure 46:
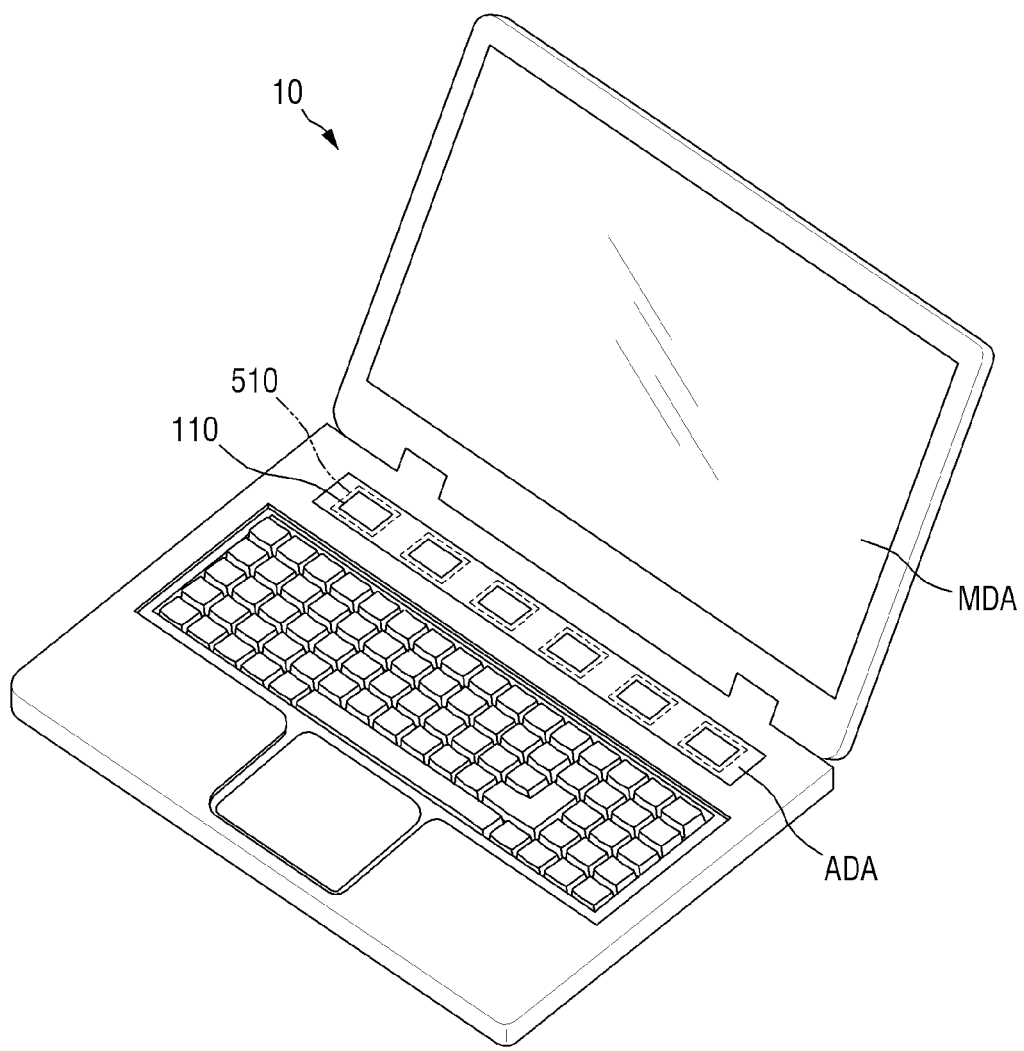
FIG. 46 illustrates tactile patterns and actuators of a display device according to an exemplary embodiment.

FIG. 46 illustrates tactile patterns 110 and actuators 510 of a display device 10 according to an exemplary embodiment.

In FIG. 46, the display device 10 is illustrated as a notebook computer including a main display portion MDA and an auxiliary display portion ADA.

Referring to FIG. 46, the display device 10 may include the main display portion MDA which displays a main image and the auxiliary display portion ADA which displays auxiliary images such as icons for volume control, screen brightness control, application switching, home screen switching, sound/vibration/silence switching, and auxiliary window on/off setting. In the auxiliary display portion ADA, a plurality of actuators 510 may be disposed, and a plurality of tactile patterns 110 respectively overlapping the actuators 510 may be disposed.

As illustrated in FIG. 46, a user may apply pressure to the tactile patterns 110 disposed on the icons to execute the icons displayed in the auxiliary display portion ADA. The display device 10 may not only sense the pressure of the user using the actuators 510 but also provide haptic feedback to the user by vibrating the actuators 510.

In a display device and a haptic feedback method of the same according to an embodiment, a tactile pattern is formed on an upper surface of a side surface portion of a cover window. As a result, due to the tactile pattern, a user can easily find an area to apply pressure to perform a desired function.

In a display device and a haptic feedback method of the same according to an embodiment, when a user applies pressure to a tactile pattern, sensing data of an actuator overlapping the tactile pattern in a width direction of a display panel may be sensed. When the sensing data of the actuator is greater than a threshold value, a predetermined function such as a power control function or a volume control function may be executed while haptic feedback is provided to the user by vibrating the actuator. Accordingly, the user can recognize whether a desired function is properly performed by the pressure applied to the tactile pattern.

In a display device and a haptic feedback method of the same according to an embodiment, when the display device does not include a tactile pattern, sensing data of an actuator may be smaller as a position to which a user applies pressure is farther from the actuator. Therefore, a position threshold value may be set to a smaller value as the distance from the actuator increases, so that the pressure applied by the user can be sensed using the actuator regardless of the position to which the user applies pressure.

In a display device and a haptic feedback method of the same according to an embodiment, when the display device does not include a tactile pattern, vibration acceleration of an actuator may be smaller as a position to which a user applies pressure is farther from the actuator. Therefore, a swing width of each driving voltage applied to the actuator may be increased as the distance from the actuator increases. Accordingly, haptic feedback of substantially the same vibration acceleration may be provided to the user regardless of the position to which the user applies pressure.

In a display device and a haptic feedback method of the same according to an embodiment, when a user applies pressure to an area of a side surface of the display device to execute a predetermined function, an actuator adjacent to the position to which the user applies pressure is selected from a plurality of actuators, and the pressure of the user is sensed using the selected actuator. Therefore, there is no need to apply a different threshold value according to the position to which the user applies pressure. In addition, because haptic feedback is provided to the user by vibrating the selected actuator, there is no need to adjust driving voltages of an actuator according to the position to which the user applies pressure.

In a display device and a haptic feedback method of the same according to an embodiment, when a user applies pressure to an area of a side surface of the display device to execute a predetermined function, final sensing data obtained by adding up first sensing data of a first actuator and second sensing data of a second actuator is compared with a threshold value to determine whether the pressure has been applied by the user. Therefore, there is no need to apply a different threshold value according to the position to which the user applies pressure. In addition, because haptic feedback is provided to the user according to final vibration acceleration obtained by adding up first vibration acceleration of the first actuator and second vibration acceleration of the second actuator, there is no need to adjust driving voltages of an actuator according to the position to which the user applies pressure.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel configured to display an image;
   a cover window on a first surface of the display panel, the cover window including a tactile pattern as a physical button;
   an actuator which is disposed on a second surface of the display panel opposite the first surface and overlapping the tactile pattern in a width direction of the display panel, and
   wherein the actuator is configured to output a sensing voltage according to applied pressure and generate vibrations according to applied driving voltages, and
   wherein a size of the tactile pattern is different according to a distance between the tactile pattern and the actuator.

2. The display device of claim 1, wherein the actuator comprises:
   a first electrode;
   a second electrode; and
   a vibration layer disposed between the first electrode and the second electrode and having a piezoelectric material,
   wherein the vibration layer is configured to output the sensing voltage to at least one of the first electrode and the second electrode according to pressure applied to the vibration layer and generate the vibrations according to a first driving voltage among the driving voltages applied to the first electrode and a second driving voltage among the driving voltages applied to the second electrode.

3. The display device of claim 1, further comprising:
   an actuator driver configured to convert the sensing voltage into sensing data which is digital data and outputs the sensing data, receive driving data to vibrate the actuator when the sensing data is greater than a threshold value, and configured to convert the driving data into driving voltages and apply the driving voltages to the actuator.

4. The display device of claim 1, wherein the tactile pattern is disposed on the first surface of the cover window.

5. The display device of claim 1, wherein the tactile pattern is an embossed pattern protruding from the cover window.

6. The display device of claim 1, wherein the tactile pattern is an intaglio pattern formed in the first surface of the cover window.

7. The display device of claim 1, wherein the tactile pattern has a polygonal, circular or oval shape in plan view.

8. The display device of claim 1, wherein the tactile pattern is shaped like a polygonal, circular or oval frame in plan view.

9. The display device of claim 1, wherein the tactile pattern includes a plurality of dots that form a polygon, a circle or an oval in plan view.

10. A display device comprising:
a display layer configured to display an image;
a sensor electrode layer disposed on the display unit and configured to sense a touch of a user;
an actuator under the display layer configured to output a sensing voltage according to applied pressure, and generate vibrations according to applied driving voltages;
a cover window disposed on the sensor electrode layer;
a sensor driver configured to receive sensor sensing voltages from sensor electrodes of the sensor electrode layer and calculate a touch position of the user when the user applies pressure onto the cover window; and
an actuator driver configured to calculate a position threshold value according to the touch position of the user, convert the sensing voltage into sensing data which is digital data and output the sensing data, receive driving data to vibrate the actuator when the sensing data is greater than the position threshold value, and convert the driving data into driving voltages and apply the driving voltages to the actuator.

11. The display device of claim 10, wherein the actuator comprises:
a first electrode, a second electrode, and a vibration layer disposed between the first electrode and the second electrode and having a piezoelectric material,
wherein the vibration layer is configured to output the sensing voltage to at least any one of the first electrode and the second electrode according to pressure applied to the vibration layer and generate the vibrations according to a first driving voltage among the driving voltages applied to the first electrode and a second driving voltage among the driving voltages applied to the second electrode.

12. The display device of claim 10, wherein the position threshold value decreases as a distance between the touch position of the user and the actuator increases.

13. The display device of claim 10, further comprising:
tactile patterns which are disposed parallel to each other in a direction on the first surface of the cover window, wherein a length of each of the tactile patterns in the direction increases as a distance from the actuator increases.

14. The display device of claim 10, further comprising:
tactile patterns which are disposed parallel to each other in a direction on the first surface of the cover window, wherein a height of each of the tactile patterns increases as a distance from the actuator increases.

15. The display device of claim 10, wherein a vibration acceleration of the actuator increases as the distance between the touch position of the user and the actuator increases.

16. The display device of claim 15, wherein a swing width of each of the driving voltages increases as the distance between the touch position of the user and the actuator increases.

17. The display device of claim 10, wherein each of the sensor driver and the actuator driver is formed as an integrated circuit.

18. The display device of claim 10, wherein the sensor driver and the actuator driver are formed as one integrated circuit.

19. A display device comprising:
a display layer configured to display an image;
a sensor electrode layer which is disposed on the display unit and is configured to sense a touch of a user;
a plurality of actuators which are disposed under the display layer and spaced apart from each other, wherein each of the actuators is configured to output a sensing voltage according to applied pressure and generate vibrations according to applied driving voltages;
a cover window which is disposed on the sensor electrode layer;
a sensor driver configured to receive sensor sensing voltages from the sensor electrode layer and calculate a touch position of the user when the user applies pressure onto the cover window; and
an actuator driver configured to select an actuator adjacent to the touch position of the user from the actuators, convert the sensing voltage into sensing data which is digital data and output the sensing data, receive driving data to vibrate the selected actuator when the sensing data of the selected actuator is greater than a threshold value, and convert the driving data into driving voltages and apply the driving voltages to the actuator.

20. The display device of claim 19, wherein each of the actuators includes a first electrode, a second electrode, and a vibration layer disposed between the first electrode and the second electrode and having a piezoelectric material, wherein the vibration layer is configured to output the sensing voltage to at least any one of the first electrode and the second electrode according to pressure applied to the vibration layer and generate the vibrations according to a first driving voltage among the driving voltages applied to the first electrode and a second driving voltage among the driving voltages applied to the second electrode.

21. A display device comprising:
a display panel configured to display an image;
a cover window disposed on a first surface of the display panel;
first and second actuators disposed on a second surface opposite the first surface of the display panel and spaced apart from each other, wherein each of the first and second actuators is configured to output a sensing voltage according to applied pressure and generate vibrations according to applied driving voltages; and
an actuator driver configured to convert a first sensing voltage of the first actuator into first sensing data and output the first sensing data and convert a second sensing voltage of the second actuator into second sensing data and output the second sensing data, receive first driving data to vibrate the first actuator and second driving data to vibrate the second actuator when final sensing data obtained by adding up the first sensing data and the second sensing data is greater than a threshold value, convert the first driving data into first sub-driving voltages and apply the first sub-driving voltages to the first actuator and convert the second driving data into second sub-driving voltages and apply the second sub-driving voltages to the second actuator.

22. A haptic feedback method of a display device, the method comprising:

applying pressure to a first surface of a display device by a user;

calculating a touch position of the user and calculating a position threshold value according to the touch position of the user;

converting a sensing voltage sensed from the actuator in response to the pressure into sensing data and comparing the sensing data with the position threshold value; and applying driving voltages to the actuator to vibrate the actuator when the sensing data is greater than the position threshold value.

23. The method of claim 22, wherein a swing width of each of the driving voltages increases as a distance between the touch position of the user and the actuator increases.

24. The method of claim 22, wherein in the applying of the pressure to the first surface of the display device by the user, the display device is configured to wake up from a sleep mode when the user touches the first surface of the display device to apply pressure to the first surface of the display device.

25. The method of claim 22, further comprising:

waking up the display device from the sleep mode when an object adjacent to the first surface of the display device is detected.

* * * * *